(12) United States Patent
Wu et al.

(10) Patent No.: US 11,646,320 B2
(45) Date of Patent: May 9, 2023

(54) PIXEL ARRAY SUBSTRATE

(71) Applicant: Au Optronics Corporation, Hsinchu (TW)

(72) Inventors: Yueh-Chi Wu, Hsinchu (TW); Ti-Kuei Yu, Hsinchu (TW); Shu-Wen Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 172 days.

(21) Appl. No.: 17/353,774

(22) Filed: Jun. 21, 2021

(65) Prior Publication Data

US 2022/0037370 A1 Feb. 3, 2022

Related U.S. Application Data

(60) Provisional application No. 63/060,259, filed on Aug. 3, 2020.

(30) Foreign Application Priority Data

Jan. 11, 2021 (TW) .................................. 110100967

(51) Int. Cl.
*H01L 27/12* (2006.01)
(52) U.S. Cl.
CPC ........ *H01L 27/1218* (2013.01); *H01L 27/124* (2013.01); *H01L 27/1248* (2013.01)
(58) Field of Classification Search
CPC ............. H01L 27/124; G02F 1/136222; G02F 1/136213
See application file for complete search history.

(56) References Cited

U.S. PATENT DOCUMENTS 10,249,653 B2 4/2019 Liu
10,859,881 B2 12/2020 Yi
(Continued)

FOREIGN PATENT DOCUMENTS

CN 106783876 5/2017
CN 106842744 6/2017
(Continued)

OTHER PUBLICATIONS

"Office Action of India Counterpart Application", dated Mar. 29, 2022, p. 1-p. 7.

*Primary Examiner* — James A Dudek
(74) *Attorney, Agent, or Firm* — JCIPRNET

(57) ABSTRACT

A pixel array substrate, including multiple pixel structures, is provided. Each of the pixel structures includes a first common electrode, a thin film transistor, a conductive pattern, a first insulating layer, a color filter pattern, a second insulating layer, and a pixel electrode. The conductive pattern is electrically connected to the thin film transistor. A first portion of the conductive pattern is disposed on the first common electrode. The first insulating layer is disposed on the conductive pattern. The color filter pattern is disposed on the first insulating layer. The second insulating layer is disposed on the color filter pattern. The pixel electrode is disposed on the second insulating layer. In a top view of the pixel array substrate, the first portion of the conductive pattern covers all edges of the first common electrode within an opening of the color filter pattern.

20 Claims, 17 Drawing Sheets

(56) References Cited

U.S. PATENT DOCUMENTS

| | | | | |
|---|---|---|---|---|
| 2008/0068537 A1* | 3/2008 | Lee | ................... | G02F 1/136209 |
| | | | | 438/30 |
| 2017/0199411 A1* | 7/2017 | Kim | ................... | H01L 29/7869 |
| 2019/0027514 A1 | 1/2019 | Liu | | |
| 2019/0361279 A1 | 11/2019 | Yi | | |

FOREIGN PATENT DOCUMENTS

| | | |
|---|---|---|
| CN | 107315287 | 11/2017 |
| CN | 108121124 | 6/2018 |
| TW | 201711174 | 3/2017 |
| TW | 202006696 | 2/2020 |
| TW | I710122 | 11/2020 |

\* cited by examiner

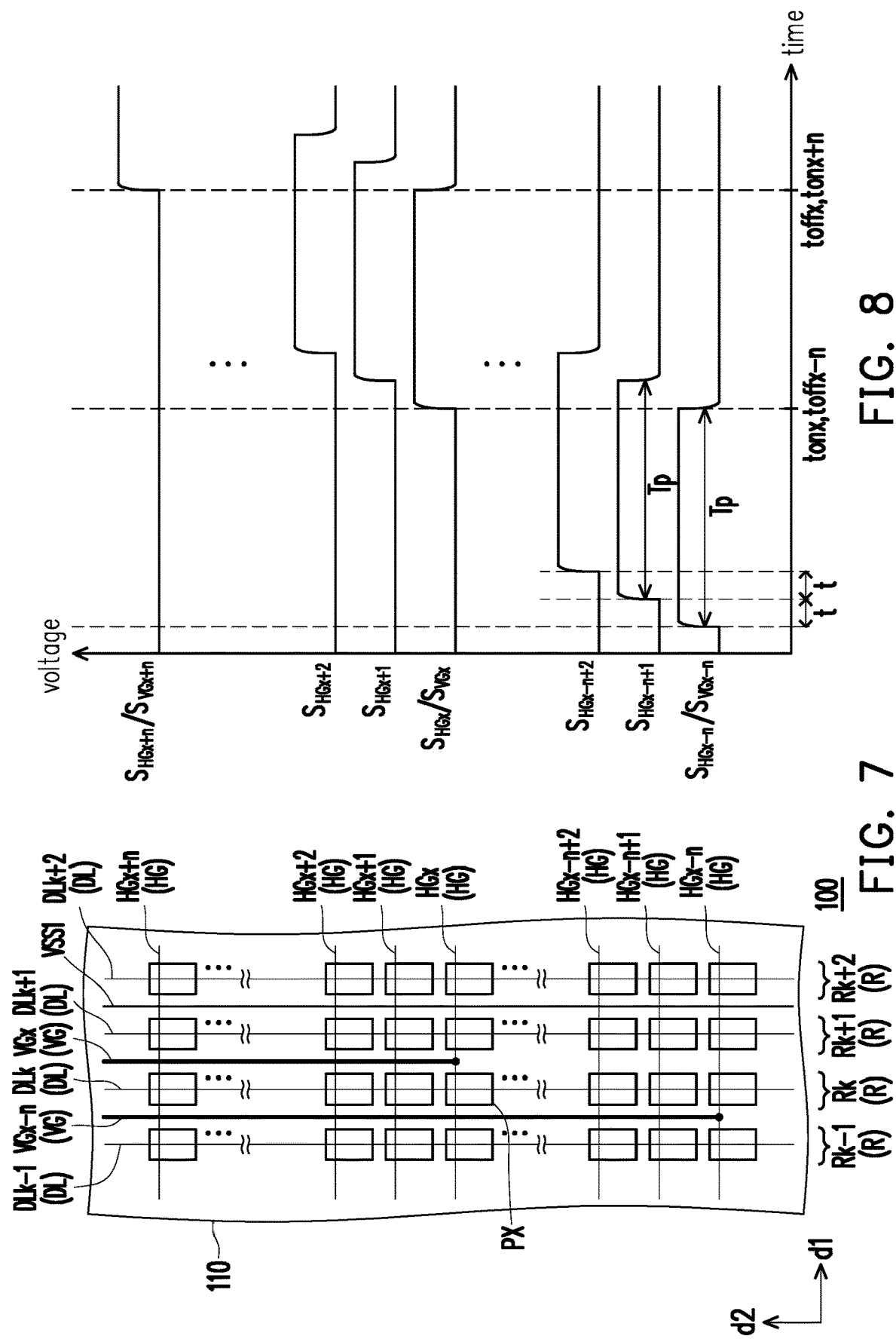

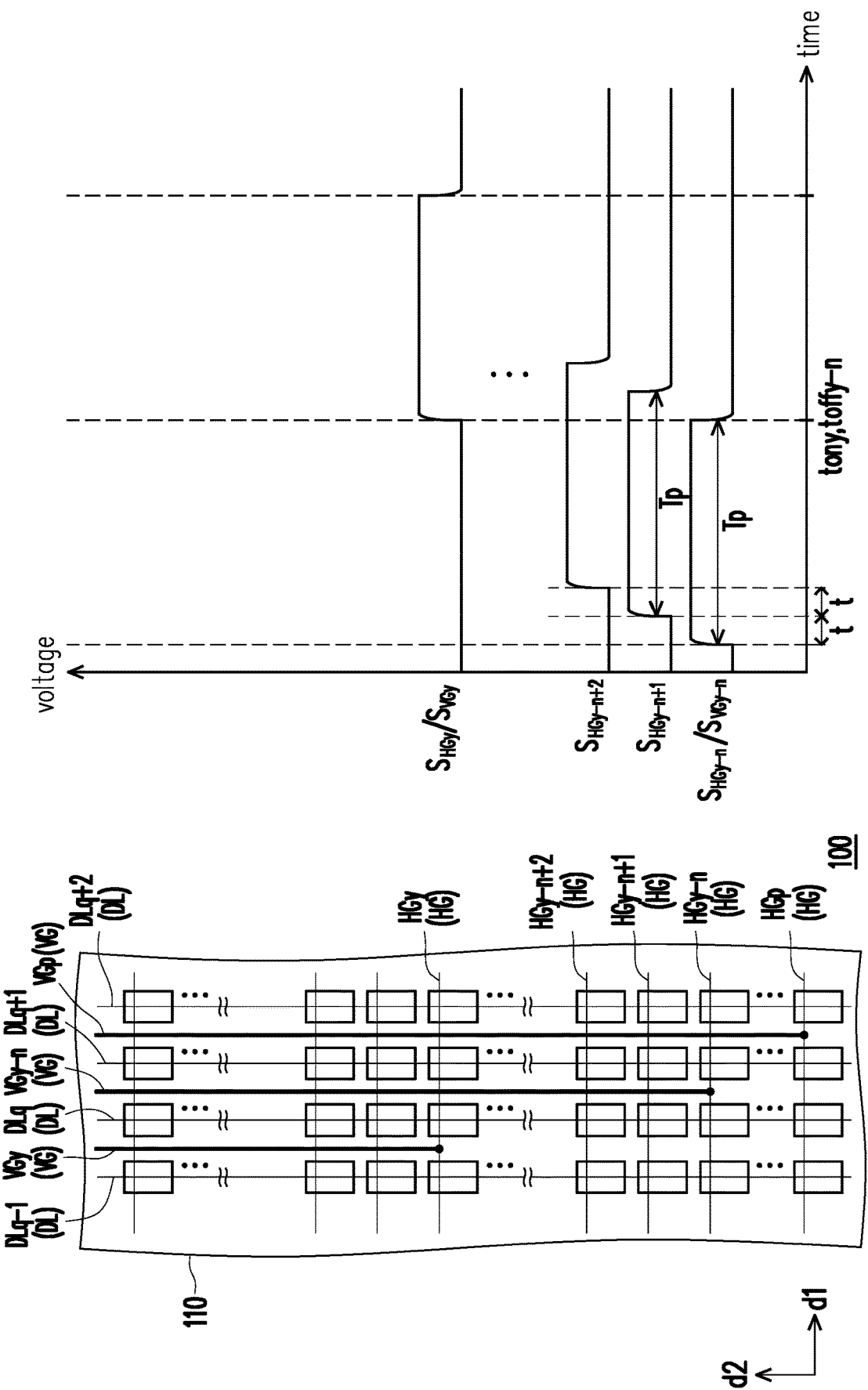

PIXEL ARRAY SUBSTRATE

CROSS-REFERENCE TO RELATED APPLICATION

This application claims the priority benefit of U.S. Provisional Application No. 63/060,259, filed on Aug. 3, 2020 and Taiwan Application No. 110100967, filed on Jan. 11, 2021. The entirety of each of the above-mentioned patent applications is hereby incorporated by reference herein and made a part of this specification.

BACKGROUND

Technical Field

The disclosure relates to a pixel array substrate.

Description of Related Art

With the development of display technology, people's requirements for display devices are no longer satisfied with optical characteristics such as high resolution, high contrast, and wide viewing angle. People also expect display devices to have an elegant appearance. For example, people expect a display device to have a narrow bezel or even no bezel.

Generally speaking, the display device includes multiple pixel structures disposed in a display region, a data driving circuit disposed below the display region, and a gate driving circuit disposed on the left, right, or left and right sides of the display region. In order to reduce the width of the left and right sides of the bezel of the display device, the gate driving circuit and the data driving circuit may be both disposed on the lower side of the display region. When the gate driving circuit is disposed on the lower side of the display region, gate lines arranged in the perpendicular direction need to be electrically connected to the gate driving circuit through transfer lines arranged in the parallel direction. However, the gate-on pulse signal of the transfer line affects the potential of other pixel structures that are still charging, thereby causing a display abnormality (for example, diagonal bright lines). Therefore, how to improve the display abnormality is one of the challenges faced by current ultra-narrow bezel display devices. In addition, how to improve the aperture ratio of the display device and enable the display device to be less prone to the appearance of bubbles are other challenges.

SUMMARY

The disclosure provides a pixel array substrate with high aperture ratio.

The pixel array substrate of the disclosure includes a substrate and multiple pixel structures disposed on the substrate. Each pixel structure includes a first common electrode, a thin film transistor, a conductive pattern, a first insulating layer, a color filter pattern, a second insulating layer, and a pixel electrode. The conductive pattern is electrically connected to the thin film transistor. A first portion of the conductive pattern is disposed on the first common electrode. The first insulating layer is disposed on the conductive pattern and has an opening overlapping with the conductive pattern. The color filter pattern is disposed on the first insulating layer and has an opening overlapping with the conductive pattern. The second insulating layer is disposed on the color filter pattern and has an opening overlapping with the conductive pattern. The pixel electrode is disposed on the second insulating layer and is electrically connected to the conductive pattern through the opening of the first insulating layer and the opening of the second insulating layer. In a top view of the pixel array substrate, the first portion of the conductive pattern covers all edges of the first common electrode located within the opening of the color filter pattern.

In an embodiment of the disclosure, each pixel structure further includes a second common electrode. The second common electrode is separated from the first common electrode. A second portion of the conductive pattern is disposed on the second common electrode. In a top view of the pixel array substrate, the second portion of the conductive pattern covers all edges of the second common electrode located within the opening of the color filter pattern.

In an embodiment of the disclosure, the conductive pattern further has a third portion. In a top view of the pixel array substrate, the third portion of the conductive pattern is located between the first common electrode and the second common electrode, and the opening of the first insulating layer and the opening of the second insulating layer are located on the third portion of the conductive pattern.

In an embodiment of the disclosure, in a top view of the pixel array substrate, the opening of the first insulating layer and the opening of the second insulating layer are located between the first common electrode and the second common electrode and do not overlap with the first common electrode and the second common electrode.

In an embodiment of the disclosure, each pixel structure further includes a third common electrode. The third common electrode is separated from the first common electrode and the second common electrode. A fourth portion of the conductive pattern is disposed on the third common electrode. In a top view of the pixel array substrate, the fourth portion of the conductive pattern covers all edges of the third common electrode located within the opening of the color filter pattern.

In an embodiment of the disclosure, an edge of the first portion of the conductive pattern and an edge of the opening of the color filter pattern are substantially aligned.

In an embodiment of the disclosure, the conductive pattern further has a fifth portion. In a top view of the pixel array substrate, the fifth portion of the conductive pattern overlaps with the first common electrode and is located outside the opening of the color filter pattern.

In an embodiment of the disclosure, the thin film transistor has a gate, which is separated from the first common electrode. The second portion of the conductive pattern is disposed on the gate. In a top view of the pixel array substrate, the second portion of the conductive pattern covers all edges of the gate located within the opening of the color filter pattern.

In an embodiment of the disclosure, the conductive pattern further has a third portion. In a top view of the pixel array substrate, the third portion of the conductive pattern is located between the first common electrode and the gate, and the opening of the first insulating layer and the opening of the second insulating layer are located on the third portion of the conductive pattern.

In an embodiment of the disclosure, in a top view of the pixel array substrate, the opening of the first insulating layer and the opening of the second insulating layer are located between the first common electrode and the gate, and the opening of the first insulating layer and the opening of the second insulating layer do not overlap with the first common electrode and the gate.

In an embodiment of the disclosure, the pixel structures are arranged into multiple pixel columns, and the pixel columns are arranged in the first direction. The pixel array substrate further includes multiple scan lines, multiple data lines, and multiple transfer lines. The scan lines are arranged in the second direction and are electrically connected to the pixel structures. The first direction and the second direction intersect. The data lines are arranged in the first direction and are electrically connected to the pixel columns. The transfer lines are arranged in the first direction and are electrically connected to the scan lines. The scan lines include an (x−n)-th scan line to an x-th scan line, which are sequentially arranged in the second direction, where x is a positive integer greater than or equal to 2, and n is a positive integer and is less than x, and a start time of a gate drive signal of the x-th scan line and an end time of a gate drive signal of the (x−n)-th section overlap in time sequence. The transfer lines include an (x−n)-th transfer line and an x-th transfer line, which are respectively electrically connected to the (x−n)-th scan line and the x-th scan line. The pixel columns include a (k−1)-th pixel column, a k-th pixel column, and a (k+1)-th pixel column, which are sequentially arranged in the first direction, where k is a positive integer greater than or equal to 2. The data lines include a (k−1)-th data line, a k-th data line, and a (k+1)-th data line, which are respectively electrically connected to the (k−1)-th pixel column, the k-th pixel column, and the (k+1)-th pixel column. In a top view of the pixel array substrate, the (x−n)-th transfer line is disposed between the (k−1)-th data line and the k-th data line, and the x-th transfer line is disposed between the k-th data line and the (k+1)-th data line.

In an embodiment of the disclosure, the scan lines include the (x−n)-th scan line to an (x+n)-th scan line, which are sequentially arranged in the second direction. An end time of the gate pulse signal of the x-th scan line and a start time of a gate pulse signal of the (x+n)-th scan line overlap in time sequence. The transfer lines further include an (x+n)-th transfer line, which is electrically connected to the (x+n)-th scan line. The pixel columns further include a (k+2)-th pixel column. The (k−1)-th pixel column, the k-th pixel column, the (k+1)-th pixel column, and the (k+2)-th pixel column are sequentially arranged in the first direction. The data lines further include a (k+2)-th data line, which is electrically connected to the (k+2)-th pixel column. In a top view of the pixel array substrate, the (x+n)-th transfer line is disposed between the (k+1)-th data line and the (k+2)-th data line.

In an embodiment of the disclosure, the pixel columns further include a (k+2)-th pixel column. The (k−1)-th pixel column, the k-th pixel column, the (k+1)-th pixel column, and the (k+2)-th pixel column are sequentially arranged in the first direction. The data lines further include a (k+2)-th data line, which is electrically connected to the (k+2)-th pixel column. The pixel array substrate further includes a first common line. In a top view of the pixel array substrate, the first common line is disposed between the (k+1)-th data line and the (k+2)-th data line.

In an embodiment of the disclosure, the pixel columns further include a (k+2)-th pixel column. The (k−1)-th pixel column, the k-th pixel column, the (k+1)-th pixel column, and the (k+2)-th pixel column are sequentially arranged in the first direction. The data lines further include a (k+2)-th data line, which is electrically connected to the (k+2)-th pixel column. The scan lines include an m-th scan line. The transfer lines further include an m-th transfer line, which is electrically connected to the m-th scan line, where m is a positive integer greater than 2, and |x−m| is not equal to n. In a top view of the pixel array substrate, the m-th transfer line is disposed between the (k+1)-th data line and the (k+2)-th data line.

In an embodiment of the disclosure, the scan lines include a (y−n)-th scan line to a y-th scan line, which are sequentially arranged in the second direction, where y is a positive integer greater than or equal to 2, and n is a positive integer and is less than y, and a start time of a gate pulse signal of the y-th scan line and an end time of a gate pulse signal of the (y−n)-th scan line overlap in time sequence. The transfer lines include a (y−n)-th transfer line and a y-th transfer line, which are respectively electrically connected to the (y−n)-th scan line and the y-th scan line. The pixel columns include a (q−1)-th pixel column, a q-th pixel column, and a (q+1)-th pixel column, which are sequentially arranged in the first direction, where q is a positive integer greater than or equal to 2. The data lines include a (q−1)-th data line, a q-th data line, and a (q+1)-th data line, which are respectively electrically connected to the (q−1)-th pixel column, the q-th pixel column, and the (q+1)-th pixel column. In a top view of the pixel array substrate, the y-th transfer line is disposed between the (q−1)-th data line and the q-th data line, and the (y−n)-th transfer line is disposed between the q-th data line and the (q+1)-th data line.

In an embodiment of the disclosure, the pixel columns further include a (q+2)-th pixel column. The (q−1)-th pixel column, the q-th pixel column, the (q+1)-th pixel column, and the (q+2)-th pixel column are sequentially arranged in the first direction. The data lines further include a (q+2)-th data line, which is electrically connected to the (q+2)-th pixel column. The pixel array substrate further includes a second common line. In a top view of the pixel array substrate, the second common line is disposed between the (q+1)-th data line and the (q+2)-th data line.

In an embodiment of the disclosure, the pixel columns further include a (q+2)-th pixel column. The (q−1)-th pixel column, the q-th pixel column, the (q+1)-th pixel column, and the (q+2)-th pixel column are sequentially arranged in the first direction. The data lines further include a (q+2)-th data line, which is electrically connected to the (q+2)-th pixel column. The scan lines include a p-th scan line. The transfer lines further include a p-th transfer line, which is electrically connected to the p-th scan line, where p is a positive integer greater than 2, and |y−p| is not equal to n. In a top view of the pixel array substrate, the p-th transfer line is disposed between the (q+1)-th data line and the (q+2)-th data line.

In an embodiment of the disclosure, n=4.

In an embodiment of the disclosure, n=8.

In an embodiment of the disclosure, one of the scan lines belongs to a first conductive layer. One of the transfer lines belongs to a second conductive layer. The pixel array substrate further includes an insulating layer, which is disposed between the first conductive layer and the second conductive layer, and has a contact window. The one of the scan lines is electrically connected to the one of the transfer lines through the contact window of the insulating layer.

BRIEF DESCRIPTION OF THE DRAWINGS

FIG. 7 is a schematic top view of a part of the pixel array substrate 100 according to an embodiment of the disclosure.

FIG. 8 shows multiple gate pulse signals $S_{HGx-n}$ to $S_{HGx+n}$ of an (x−n)-th scan line HGx−n to an (x+n)-th scan line HGx+n of FIG. 7.

FIG. 13 is a schematic top view of a part of the pixel array substrate 100 according to an embodiment of the disclosure.

FIG. 14 shows multiple gate pulse signals $S_{HGy-n}$ to $S_{HGy}$ of a (y−n)-th scan line HGy−n to a y-th scan line HGy of FIG. 13.

DETAILED DESCRIPTION OF DISCLOSED EMBODIMENTS

Figure 2:
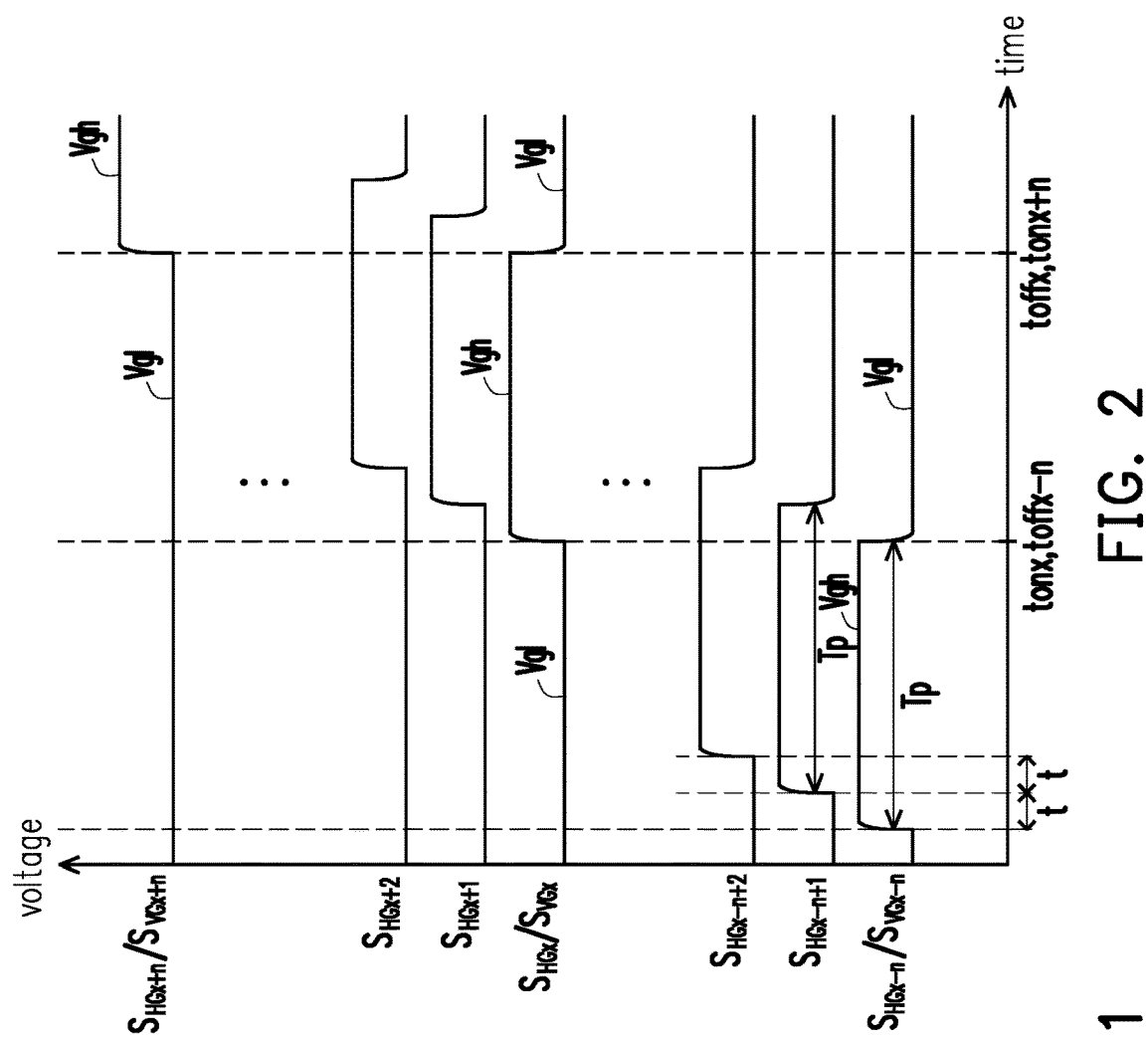
FIG. 2 shows multiple gate pulse signals $S_{HGx-n}$ to $S_{HGx+n}$ of an (x−n)-th scan line HGx−n to an (x+n)-th scan line HGx+n of FIG. 1.

Reference will now be made in detail to the exemplary embodiments of the disclosure, and examples of the exemplary embodiments are illustrated in the accompanying drawings. Whenever possible, the same reference numerals are used in the drawings and descriptions to represent the same or similar parts.

It should be understood that when an element such as a layer, film, region, or substrate is referred to as being "on" or "connected to" another element, the element may be directly on or connected to the another element, or there may be an intermediate element therebetween. In contrast, when an element is referred to as being "directly on" or "directly connected to" another element, there is no intermediate element. As used herein, "connection" may refer to physical and/or electrical connection. Furthermore, "electrical connection" or "coupling" may mean that there is another element between two elements.

As used herein, "about", "approximately", or "substantially" includes the stated value and an average value within an acceptable range of deviation from the specific value determined by persons skilled in the art while taking into account the measurement in question and the specific amount of measurement-related errors (that is, the limitation of the measurement system). For example, "about" may represent being within one or more standard deviations, ±30%, ±20%, ±10%, or ±5% of the stated value. Furthermore, "about", "approximately", or "substantially" used herein may select a more acceptable range of deviation or standard deviation according to optical properties, etching properties, or other properties, and one standard deviation may not be applied to all properties.

Unless otherwise defined, all terms (comprising technical and scientific terms) used herein have the same meaning as commonly understood by persons skilled in the art of the disclosure. It will be further understood that terms such as those defined in commonly used dictionaries should be interpreted as having meanings consistent with the meanings in the context of the art and the disclosure, and will not be interpreted as having idealized or overly formal meanings unless explicitly defined herein.

Figure 1:
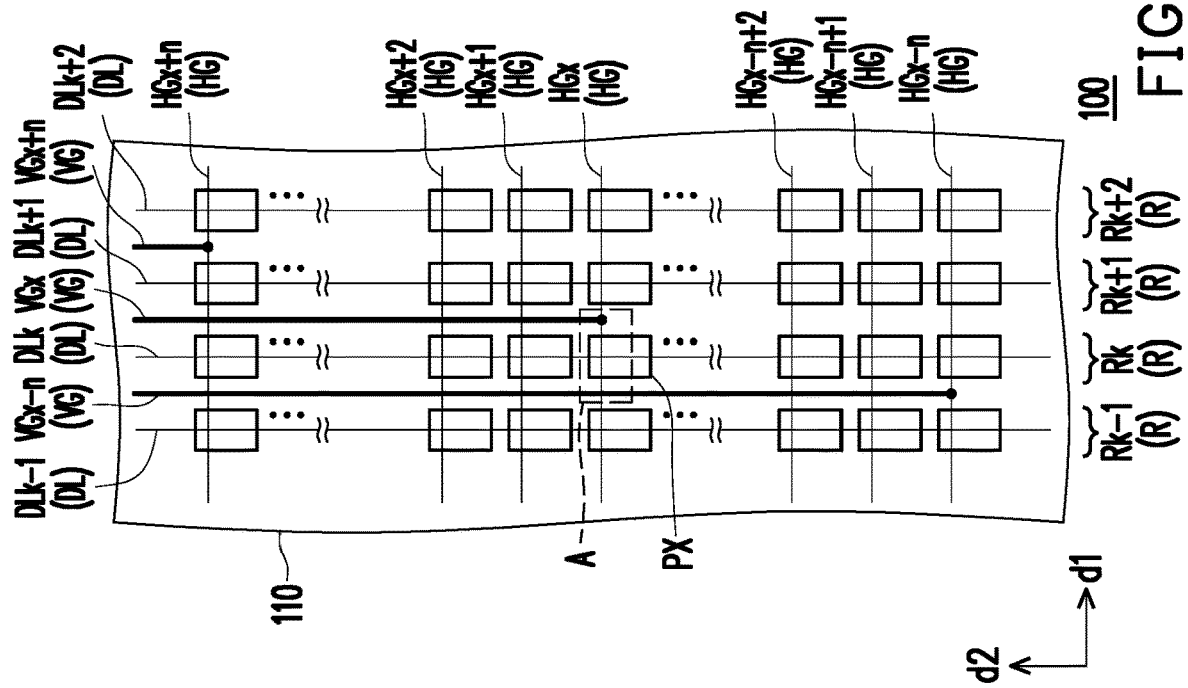
FIG. 1 is a schematic top view of a part of a pixel array substrate 100 according to an embodiment of the disclosure.

FIG. 1 is a schematic top view of a part of a pixel array substrate 100 according to an embodiment of the disclosure.

FIG. 2 shows multiple gate pulse signals $S_{HGx-n}$ to $S_{HGx+n}$ of an (x−n)-th scan line HGx−n to an (x+n)-th scan line HGx+n of FIG. 1.

Figure 3:
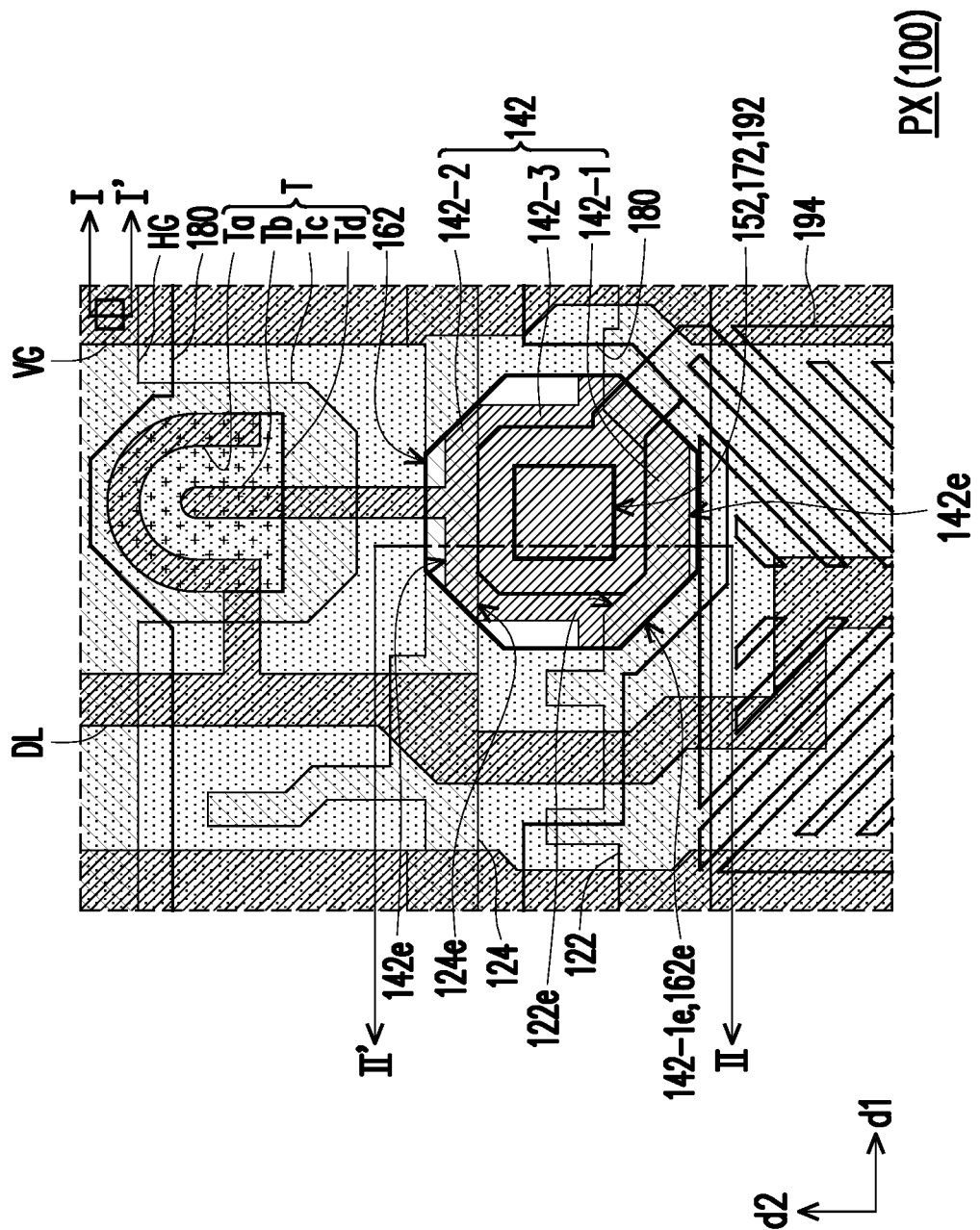
FIG. 3 is a schematic top view of a layout of a pixel structure PX of the pixel array substrate 100 according to an embodiment of the disclosure.

FIG. 3 is a schematic top view of a layout of a pixel structure PX of the pixel array substrate 100 according to an embodiment of the disclosure. FIG. 3 corresponds to a region A of FIG. 1.

Figure 4:
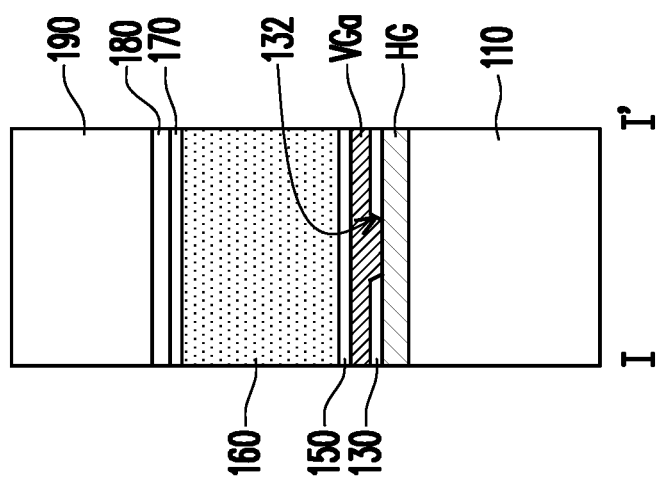
FIG. 4 is a schematic cross-sectional view of the pixel array substrate 100 according to an embodiment of the disclosure.

FIG. 4 is a schematic cross-sectional view of the pixel array substrate 100 according to an embodiment of the disclosure. FIG. 4 corresponds to a section line I-I' of FIG. 3.

Please refer to FIG. 1 and FIG. 4. The pixel array substrate 100 includes a substrate 110. For example, in this embodiment, the material of the substrate 110 may be glass. However, the disclosure is not limited thereto. In other embodiments, the material of the substrate 110 may also be quartz, an organic polymer, an opaque/reflective material (for example, a wafer, ceramics, etc.), or other applicable materials.

Please refer to FIG. 1. The pixel array substrate 100 further includes multiple pixel structures PX, which are disposed on the substrate 110. The pixel structures PX are arranged into multiple pixel columns R. The pixel columns R are arranged in a first direction d1.

Please refer to FIG. 1 and FIG. 3. Each pixel structure PX includes a thin film transistor T and a pixel electrode 194. The thin film transistor T has a source Ta, a drain Tb, a gate Tc, and a semiconductor pattern Td. An insulating layer 130 (shown in FIG. 4) is sandwiched between the gate Tc and the semiconductor pattern Td. The insulating layer 130 may also be referred to as a gate insulating layer. The source Ta and the drain Tb are respectively electrically connected to two different regions of the semiconductor pattern Td, and the pixel electrode 194 is electrically connected to the drain Tb.

For example, in this embodiment, the gate Tc of the thin film transistor T may belong to a first conductive layer, and the source Ta and the drain Tb of the thin film transistor T may belong to a second conductive layer, but the disclosure is not limited thereto.

In this embodiment, the first conductive layer may be a first metal layer, that is, the material of the first conductive layer may be metal. However, the disclosure is not limited thereto. In other embodiments, the material of the first conductive layer may be other conductive materials, such as alloys, nitrides of metallic materials, oxides of metallic materials, oxynitrides of metallic materials, or stacked layers of metallic materials and other conductive materials.

In this embodiment, the second conductive layer may be a second metal layer, that is, the material of the second conductive layer may be metal. However, the disclosure is not limited thereto. In other embodiments, the material of the second conductive layer may also be other conductive materials, such as alloys, nitrides of metallic materials, oxides of metallic materials, oxynitrides of metallic materials, or stacked layers of metallic materials and other conductive materials.

Please refer to FIG. 1 and FIG. 3. The pixel array substrate 100 further includes multiple scan lines HG, which are arranged in a second direction d2. The first direction d1 and the second direction d2 intersect. For example, in this embodiment, the first direction d1 and the second direction d2 may be perpendicular, but the disclosure is not limited thereto. The scan lines HG are electrically connected to the pixel structures PX. In detail, the scan lines HG are electrically connected to the gate Tc of the thin film transistor T of the pixel structures PX. In this embodiment, the scan line HG may belong to the first conductive layer, but the disclosure is not limited thereto.

Please refer to FIG. 1 and FIG. 3. The pixel array substrate 100 further includes multiple data lines DL, which are arranged in the first direction d1 and are electrically connected to the pixel columns R. In detail, in this embodiment, the data lines DL are electrically connected to the source Ta of the thin film transistor T of the pixel columns R, and the sources Ta of the pixel structures PX of the same pixel column R are electrically connected to the same data line DL. In this embodiment, the data line DL may belong to the second conductive layer, but the disclosure is not limited thereto.

Please refer to FIG. 1 and FIG. 3. The pixel array substrate 100 further includes multiple transfer lines VG, which are arranged in the first direction d1 and are electrically connected to the scan lines HG. Please refer to FIG. 1, FIG. 3, and FIG. 4. For example, in this embodiment, the scan line HG belongs to the first conductive layer, and at least one portion VGa (labelled in FIG. 4) of the transfer line VG belongs to the second conductive layer; the insulating layer 130 is disposed between the first conductive layer and the second conductive layer, and has a contact window 132 (labelled in FIG. 4); and the at least one portion VGa of the transfer line VG is electrically connected to the scan line HG through the contact window 132 of the insulating layer 130.

Please refer to FIG. 1. The scan lines HG include an (x−n)-th scan line HGx−n to an (x+n)-th scan line HGx+n, which are sequentially arranged in the second direction d2, where x is a positive integer greater than or equal to 2, and n is a positive integer and is less than x.

Please refer to FIG. 1 and FIG. 2. The (x−n)-th scan line HGx−n to the (x+n)-th scan line HGx+n respectively have a gate pulse signal $S_{HGx-n}$ to a gate pulse signal $S_{HGx+n}$. In detail, the (x−n)-th scan line HGx−n has the gate pulse signal $S_{HGx-n}$, the (x−n+1)-th scan line HGx−n+1 has the gate pulse signal $S_{HGx-n+1}$, the (x−n+2)-th scan line HGx−n+2 has the gate pulse signal $S_{HGx-n+2}$, . . . , the x-th scan line HGx has the gate pulse signal $S_{HGx}$, the (x+1)-th scan line HGx+1 has the gate pulse signal $S_{HGx+1}$, the (x+2)-th scan line HGx+2 has the gate pulse signal $S_{HGx+2}$, . . . , and the (x+n)-th scan line HGx+n has the gate pulse signal $S_{HGx+n}$.

Please refer to FIG. 1 and FIG. 2. In this embodiment, the (x−n)-th scan line HGx−n to the (x+n)-th scan line HGx+n are sequentially turned on with a time delay. A time length of the time delay is t (shown in FIG. 2), and a pulse time length of each of the gate pulse signal $S_{HGx-n}$ to the gate pulse signal $S_{HGx+n}$ is Tp (shown in FIG. 2), where n=Tp/t. A start time tonx of the gate pulse signal $S_{HGx}$ of the x-th scan line HGx and an end time toffx−n of the gate pulse signal $S_{HGx-n}$ of the (x−n)-th scan line HGx−n overlap in time sequence. In other words, a time period when the gate pulse signal $S_{HGx}$ of the x-th scan line HGx rises from a low potential Vgl to a high potential Vgh and a time period when the gate pulse signal $S_{HGx-n}$ of the (x−n)-th scan line HGx−n drops from the high potential Vgh to the low potential Vgl at least partially overlap in time sequence. An end time toffx of the gate pulse signal $S_{HGx}$ of the x-th scan line HGx and a start time tonx+n of the gate pulse signal $S_{HGx+n}$ of the (x+n)-th scan line HGx+n overlap in time sequence. In other words, a time period when the gate pulse signal $S_{HGx}$ of the x-th scan line HGx drops from the high potential Vgh to the low potential Vgl and a time period when the gate pulse signal $S_{HGx+n}$ of the (x+n)-th scan line HGx+n rises from the low potential Vgl to the high potential Vgh at least partially overlap in time sequence.

Please refer to FIG. 1. The transfer lines VG include an (x−n)-th transfer line VGx−n, an x-th transfer line VGx, and an (x+n)-th transfer line VGx+n, which are respectively electrically connected to the (x−n)-th scan line HGx−n, the x-th scan line HGx, and the (x+n)-th scan line HGx+n. Please refer to FIG. 1 and FIG. 2. The (x−n)-th transfer line VGx−n, the x-th transfer line VGx, and the (x+n)-th transfer line VGx+n respectively have a gate pulse signal $S_{VGx-n}$, a gate pulse signal $S_{VGx}$, and a gate pulse signal $S_{VGx+n}$. The gate pulse signal $S_{VGx-n}$ of the (x−n)-th transfer line VGx−n, the gate pulse signal $S_{VGx}$ of the x-th transfer line VGx, and the gate pulse signal $S_{VGx+n}$ of the (x+n)-th transfer line VGx+n are respectively the same as the gate pulse signal $S_{HGx-n}$ of the (x−n)-th scan line HGx−n, the gate pulse signal $S_{HGx}$ of the x-th scan line HGx, and the gate pulse signal $S_{HGx+n}$ of the (x+n)-th scan line HGx+n.

Please refer to FIG. 1. The pixel columns R include a (k−1)-th pixel column Rk−1, a k-th pixel column Rk, and a (k+1)-th pixel column Rk+1, which are sequentially arranged in the first direction d1, where k is a positive integer greater than or equal to 2; and the data lines DL include a (k−1)-th data line DLk−1, a k-th data line DLk, and a (k+1)-th data line DLk+1, which are respectively electrically connected to the (k−1)-th pixel column Rk−1, the k-th pixel column Rk, and the (k+1)-th pixel column Rk+1.

Please refer to FIG. 1. It is worth noting that in the top view of the pixel array substrate 100, the (x−n)-th transfer line VGx−n is disposed between the (k−1)-th data line DLk−1 and the k-th data line DLk, and the x-th transfer line VGx is disposed between the k-th data line DLk and the (k+1)-th data line DLk+1. In other words, the (x−n)-th transfer line VGx−n and the x-th transfer line VGx are adjacent to the same k-th data line DLk and are respectively located on the left and right sides of the same k-th data line DLk. Please refer to FIG. 1 and FIG. 2. In particular, since the start time tonx of the gate pulse signal $S_{VGx}$ of the x-th transfer line VGx and the end time toffx−n of the gate pulse signal $S_{VGx-n}$ of the (x−n)-th transfer line VGx−n overlap in time sequence, the capacitive coupling effect between the (x−n)-th transfer line VGx−n and the k-th data line DLk may offset the capacitive coupling effect between the x-th transfer line VGx and the k-th data line DLk, so that the potential of the pixel electrode 194 (shown in FIG. 3) of the pixel structure PX located in the k-th pixel column Rk and electrically connected to the x-th scan line HGx is not prone to excessive deviation from an ideal value due to the transfer lines VG disposed on the left and right sides thereof. As a result, the pixel structure PX located in the k-th pixel column Rk and electrically connected to the x-th scan line HGx is less prone to abnormal brightness (for example, over-brightness), thereby improving the issue of diagonal bright lines described in the prior art. The following is exemplified in detail with other drawings.

Figure 5:
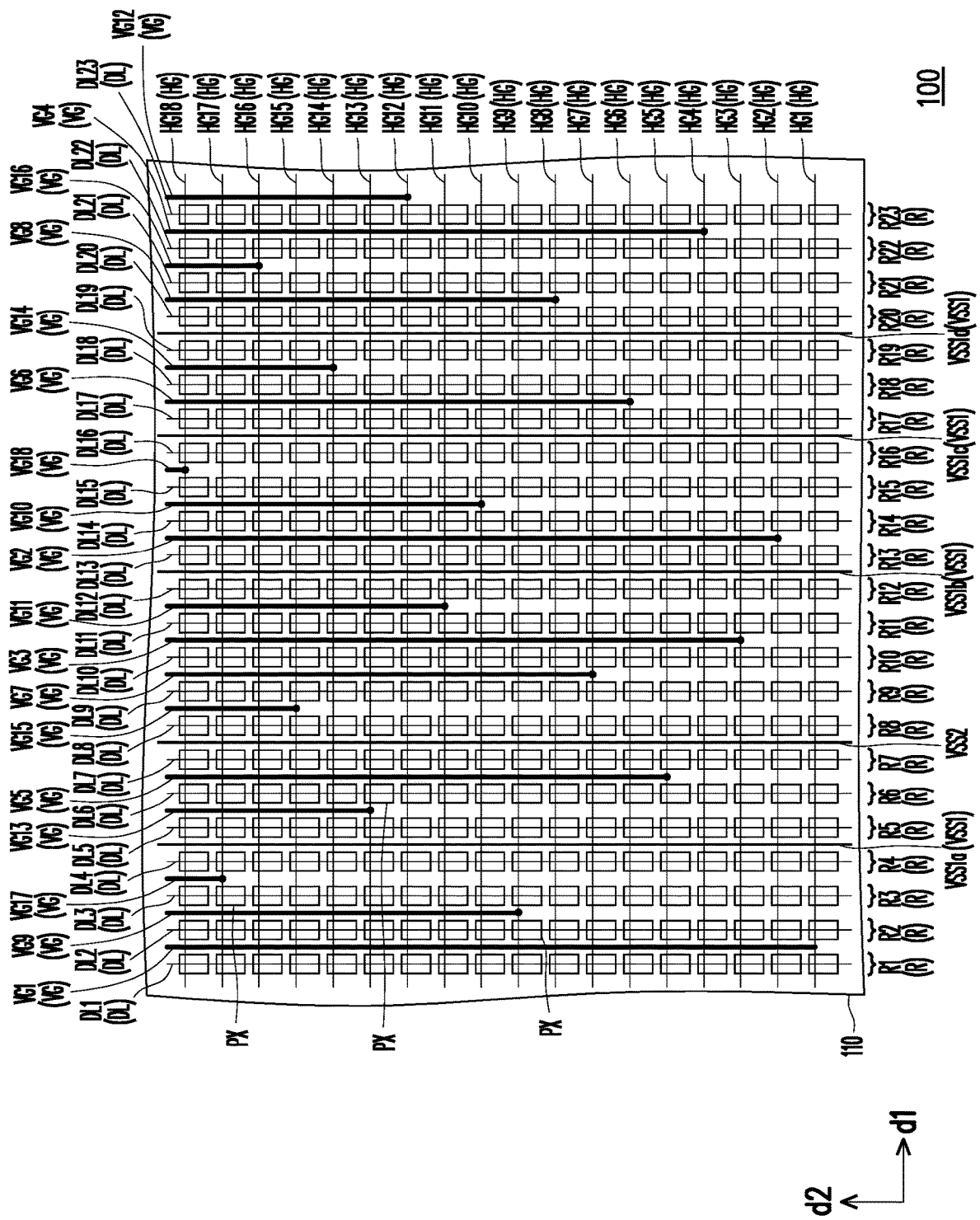
FIG. 5 is a schematic top view of the pixel array substrate 100 according to an embodiment of the disclosure.

FIG. 5 is a schematic top view of the pixel array substrate 100 according to an embodiment of the disclosure.

Figure 6:
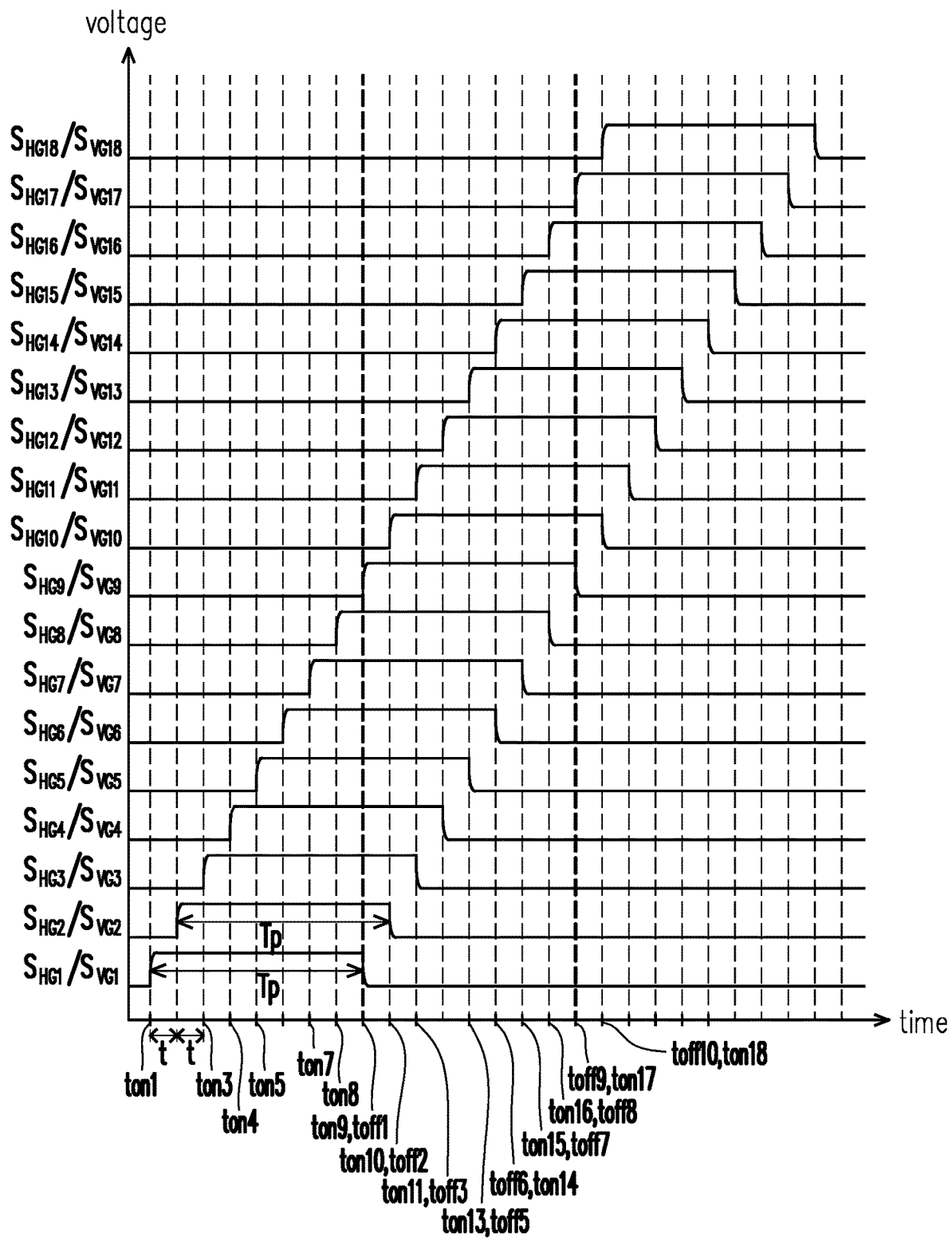
FIG. 6 shows multiple gate pulse signals $S_{HG1}$ to $S_{HG18}$ of a 1-st scan line HG1 to an 18-th scan line HG18 according to an embodiment of the disclosure.

FIG. 6 shows multiple gate pulse signals $S_{HG1}$ to $S_{HG18}$ of a 1-st scan line HG1 to an 18-th scan line HG18 according to an embodiment of the disclosure.

Please refer to FIG. 5. The pixel structures PX are disposed on the substrate 110 and are arranged into a 1-st pixel column R1 to a 23-rd pixel column R23. The 1-st pixel column R1 to the 23-rd pixel column R23 are arranged in the first direction d1. The scan lines HG include the 1-st scan line HG1 to the 18-th scan line HG18, which are sequentially arranged in the second direction d2. The data lines DL include a 1-st data line DL1 to a 23-rd data line DL23, which are respectively electrically connected to the 1-st pixel column R1 to the 23-rd pixel column R23.

Please refer to FIG. 5 and FIG. 6. The 1-st scan line HG1 to the 18-th scan line HG18 respectively have the gate pulse signals $S_{HG1}$ to $S_{HG18}$. In this embodiment, the 1-st scan line HG1 to the 18-th scan line HG18 are sequentially turned on with a time delay. A time length of the time delay is t (shown in FIG. 6), and a pulse time length of each of the gate pulse signal $S_{HG1}$ to the gate pulse signal $S_{HG18}$ is Tp (shown in FIG. 6), where n=Tp/t, and n is for example 8, but the disclosure is not limited thereto.

Please refer to FIG. 5. The transfer lines VG include a 1-st transfer line VG1 to an 18-th transfer line VG18, which are respectively electrically connected to the 1-st scan line HG1 to the 18-th scan line HG18. Please refer to FIG. 5 and FIG. 6. The 1-st transfer line VG1 to the 18-th transfer line VG18 respectively have a gate pulse signal $S_{VG1}$ to a gate pulse signal $S_{VG18}$. The gate pulse signal $S_{VG1}$ of the 1-st transfer line VG1 to the gate pulse signal $S_{VG18}$ of the 18-th transfer line VG18 are respectively the same as the gate pulse signal $S_{HG1}$ of the 1-st scan line HG1 to the gate pulse signal $S_{HG18}$ of the 18-th scan line HG18.

Please refer to FIG. 1 and FIG. 2 again. The scan lines HG include the (x−n)-th scan line HGx−n to the (x+n)-th scan line HGx+n, which are sequentially arranged in the second direction d2, where x is a positive integer greater than or equal to 2, and n is a positive integer and is less than x; the start time tonx of the gate pulse signal $S_{HGx}$ of the x-th scan line HGx and the end time toffx−n of the gate pulse signal $S_{HGx-n}$ of the (x−n)-th scan line HGx−n overlap in time sequence; the end time toffx of the gate pulse signal $S_{HGx}$ of the x-th scan line HGx and the start time tonx+n of the gate pulse signal $S_{HGx+n}$ of the (x+n)-th scan line HGx+n overlap in time sequence; the transfer lines VG include the (x−n)-th transfer line VGx−n, the x-th transfer line VGx, and the (x+n)-th transfer line VGx+n, which are respectively electrically connected to the (x−n)-th scan line HGx−n, the x-th scan line HGx, and the (x+n)-th scan line HGx+n; the pixel columns R include the (k−1)-th pixel column Rk−1, the k-th pixel column Rk, and the (k+1)-th pixel column Rk+1, which are sequentially arranged in the first direction d1, where k is a positive integer greater than or equal to 2; and the data lines DL include the (k−1)-th data line DLk−1, the k-th data line DLk, and the (k+1)-th data line DLk+1, which are respectively electrically connected to the (k−1)-th pixel column Rk−1, the k-th pixel column Rk, and the (k+1)-th pixel column Rk+1. In the top view of the pixel array substrate 100, the (x−n)-th transfer line VGx−n is disposed between the (k−1)-th data line DLk−1 and the k-th data line DLk, and the x-th transfer line VGx is disposed between the k-th data line DLk and the (k+1)-th data line DLk+1. The following is exemplified with FIG. 5 and FIG. 6.

Please refer to FIG. 5 and FIG. 6. In a part of the pixel array substrate 100 of this embodiment, n, x, and k described in the foregoing paragraph may be respectively regarded as 8, 9, and 2 (that is, n=8, x=9, and k=2). Please refer to FIG. 5 and FIG. 6. In a part of the pixel array substrate 100 of this embodiment, the scan lines HG include the 1-st scan line HG1 to the 17-th scan line HG17, which are sequentially arranged in the second direction d2; a start time ton9 of the gate pulse signal $S_{HG9}$ of the 9-th scan line HG9 and an end time toff1 of the gate pulse signal $S_{HG1}$ of the 1-st scan line HG1 overlap in time sequence; an end time toff9 of the gate pulse signal $S_{HG9}$ of the 9-th scan line HG9 and a start time ton17 of the gate pulse signal $S_{HG17}$ of the 17-th scan line HG17 overlap in time sequence; the transfer lines VG include the 1-st transfer line VG1, the 9-th transfer line VG9, and the 17-th transfer line VG17, which are respectively electrically connected to the 1-st scan line HG1, the 9-th scan line HG9, and the 17-th scan line HG17; the pixel columns R include the 1-st pixel column R1, the 2-nd pixel column R2, and the 3-rd pixel column R3, which are sequentially arranged in the first direction d1; the data lines DL include the 1-st data line DL1, the 2-nd data line DL2, and the 3-rd data line DL3, which are respectively electrically connected to the 1-st pixel column R1, the 2-nd pixel column R2, and the 3-rd pixel column R3. In the top view of the pixel array substrate 100, the 1-st transfer line VG1 is disposed between the 1-st data line DL1 and the 2-nd data line DL2, and the 9-th transfer line VG is disposed between the 2-nd data line DL2 and the 3-rd data line DL3.

Please refer to FIG. 5. In other words, the 1-st transfer line VG1 and the 9-th transfer line VG9 are adjacent to the 2-nd data line DL2 and are respectively located on the left and right sides of the 2-nd data line DL2. Please refer to FIG. 5 and FIG. 6. In particular, since the start time ton9 of the gate pulse signal $S_{VG9}$ of the 9-th transfer line VG9 and the end time toff1 of the gate pulse signal $S_{VG1}$ of the 1-st transfer line VG1 overlap in time sequence, the capacitive coupling effect between the 1-st transfer line VG1 and the 2-nd data line DL2 may offset the capacitive coupling effect between the 9-th transfer line VG9 and the 2-nd data line DL2, so that the potential of the pixel electrode 194 (shown in FIG. 3) of the pixel structure PX located in the 2-nd pixel column R2 and electrically connected to the 9-th scan line HG9 is not prone to excessive deviation from the ideal value due to the transfer lines VG disposed on the left and right sides thereof. In this way, the pixel structure PX located in the 2-nd pixel column R2 and electrically connected to the 9-th scan line HG9 is not prone to abnormal brightness (for example, over-brightness), thereby improving the issue of diagonal bright lines described in the prior art.

Please refer to FIG. 1 and FIG. 2 again. The scan lines HG include the (x−n)-th scan line HGx−n to the (x+n)-th scan line HGx+n, which are sequentially arranged in the second direction d2, and the end time toffx of the gate pulse signal $S_{HGX}$ of the x-th scan line HGx and the start time tonx+n of the gate pulse signal $S_{HGx+n}$ of the (x+n)-th scan line HGx+n overlap in time sequence; the transfer lines VG further include the (x+n)-th transfer line VGx+n, which is electrically connected to the (x+n)-th scan line HGx+n; the pixel columns R further include a (k+2)-th pixel column Rk+2, and the (k−1)-th pixel column Rk−1, the k-th pixel column Rk, the (k+1)-th pixel column Rk+1, and the (k+2)-th pixel column Rk+2 are sequentially arranged in the first direction d1; and the data lines DL further include a (k+2)-th data line DLk+2, which is electrically connected to the (k+2)-th pixel column Rk+2. In the top view of the pixel array substrate 100, the (x+n)-th transfer line VGx+n is disposed between the (k+1)-th data line DLk+1 and the (k+2)-th data line DLk+2. The following is exemplified with FIG. 5 and FIG. 6.

Please refer to FIG. 5 and FIG. 6. In a part of the pixel array substrate 100 of this embodiment, n, x, and k described in the foregoing paragraph may be respectively regarded as 8, 9, and 2 (that is, n=8, x=9, and k=2). Please refer to FIG. 5 and FIG. 6. In a part of the pixel array substrate 100 of this embodiment, the scan lines HG include the 1-st scan line HG1 to the 17-th scan line HG17, which are sequentially arranged in the second direction d2, and the end time toff9 of the gate pulse signal $S_{HG9}$ of the 9-th scan line HG9 and the start time ton17 of the gate pulse signal $S_{HG17}$ of the 17-th scan line HG17 overlap in time sequence; the transfer lines VG further include the 17-th transfer line VG17, which is electrically connected to the 17-th scan line HG17; the pixel columns R further include a 4-th pixel column R4, and the 1-st pixel column R1, the 2-nd pixel column R2, the 3-rd pixel column R3, and the 4-th pixel column R4 are sequentially arranged in the first direction d1; and the data lines DL further include a 4-th data line DL4, which is electrically connected to the 4-th pixel column R4. In the top view of the pixel array substrate 100, the 17-th transfer line VG17 is disposed between the 3-rd data line DL3 and the 4-th data line DL4.

Please refer to FIG. 5. In other words, the 9-th transfer line VG9 and the 17-th transfer line VG17 are adjacent to the 3-rd data line DL3 and are respectively located on the left and right sides of the 3-rd data line DL3. Please refer to FIG. 5 and FIG. 6. Similarly, since the end time toff9 of the gate pulse signal $S_{VG9}$ of the 9-th transfer line VG9 and the start time ton17 of the gate pulse signal $S_{VG17}$ of the 17-th transfer line VG17 overlap in time sequence, the capacitive coupling effect between the 9-th transfer line VG9 and the 3-rd data line DL3 may offset the capacitive coupling effect between the 17-th transfer line VG9 and the 3-rd data line DL3, so that the potential of the pixel electrode 194 (shown in FIG. 3) of the pixel structure PX located in the third pixel column R3 and electrically connected to the 17-th scan line HG17 is not prone to excessive deviation from the ideal value due to the transfer lines VG disposed on the left and right sides thereof. In this way, the pixel structure PX located in the 3-rd pixel column R3 and electrically connected to the 17-th scan line HG17 is not prone to abnormal brightness (for example, over-brightness), thereby improving the issue of diagonal bright lines described in the prior art.

FIG. 7 is a schematic top view of a part of the pixel array substrate 100 according to an embodiment of the disclosure.

FIG. 8 shows multiple gate pulse signals $S_{HGx-n}$ to $S_{HGx+n}$ of an (x−n)-th scan line HGx−n to an (x+n)-th scan line HGx+n of FIG. 7.

Please refer to FIG. 7 and FIG. 8. The scan lines HG include the (x−n)-th scan line HGx−n to the x-th scan line HGx, which are sequentially arranged in the second direction d2, where x is a positive integer greater than or equal to 2, and n is a positive integer and is less than x; the start time tonx of the gate pulse signal $S_{HGx}$ of the x-th scan line HGx and the end time toffx−n of the gate pulse signal $S_{HGx-n}$ of the (x−n)-th scan line HGx−n overlap in time sequence; the transfer lines VG include the (x−n)-th transfer line VGx−n and the x-th transfer line VGx, which are respectively electrically connected to the (x−n)-th scan line HGx−n and the x-th scan line HGx; the pixel columns R include the (k−1)-th pixel column Rk−1, the k-th pixel column Rk, the (k+1)-th pixel column Rk+1, and the (k+2)-th pixel column Rk+2, which are sequentially arranged in the first direction d1, where k is a positive integer greater than or equal to 2; the data lines DL include the (k−1)-th data line DLk−1, the k-th data line DLk, the (k+1)-th data line DLk+1, and the (k+2)-th data line DLk+2, which are respectively electrically connected to the (k−1)-th pixel column Rk−1, the k-th pixel column Rk, the (k+1)-th pixel column Rk+1, and the (k+2)-th pixel column Rk+2; and the pixel array substrate 100 further includes a first common line VSS1. In the top view of the pixel array substrate 100, the (x−n)-th transfer line VGx−n is disposed between the (k−1)-th data line DLk−1 and the k-th data line DLk, the x-th transfer line VGx is disposed between the k-th data line DLk and the (k+1)-th data line DLk+1, and the first common line VSS1 is disposed between the (k+1)-th data line DLk+1 and the (k+2)-th data line DLk+2. The following is exemplified with FIG. 5 and FIG. 6.

Please refer to FIG. 5 and FIG. 6. In a part of the pixel array substrate 100 of this embodiment, n, x, and k described in the foregoing paragraph may be respectively regarded as 8, 17, and 3 (that is, n=8, x=17, and k=3). Please refer to FIG. 5 and FIG. 6. The scan lines HG include the 9-th scan line HG9 to the 17-th scan line HG17, which are sequentially arranged in the second direction d2; the start time ton17 of the gate pulse signal $S_{HG17}$ of the 17-th scan line HG17 and the end time toff9 of the gate pulse signal $S_{HG9}$ of the 9-th scan line HG9 overlap in time sequence; the transfer lines VG include the 9-th transfer line VG9 and the 17-th transfer line VG17, which are respectively electrically connected to the 9-th scan line HG9 and the 17-th scan line HG17; the pixel columns R include the 2-nd pixel column R2, the 3-rd pixel column R3, the 4-th pixel column R4, and the 5-th pixel column R5, which are sequentially arranged in the first direction d1; the data lines DL include the 2-nd data line DL2, the 3-rd data line DL3, the 4-th data line DL4, and the 5-th data line DL5, which are respectively electrically connected to the 2-nd pixel column R2, the 3-rd pixel column R3, the 4-th pixel column R4, and the 5-th pixel column R5; and the pixel array substrate 100 further includes a first common line VSS1a. In the top view of the pixel array substrate 100, the 9-th transfer line VG9 is disposed between the 2-nd data line DL2 and the 3-rd data line DL3, the 17-th transfer line VG17 is disposed between the 3-rd data line DL3 and the 4-th data line DL4, and the first common line VSS1a is disposed between the 4-th data line DL4 and the 5-th data line DL5.

Please refer to FIG. 5 and FIG. 6. In another part of the pixel array substrate 100 of this embodiment, n, x, and k described in the foregoing two paragraphs may also be respectively regarded as 8, 11, and 11 (that is, n=8, x=11, and k=11). Please refer to FIG. 5 and FIG. 6. The scan lines HG include the 3-rd scan line HG3 to the 11-th scan line HG11, which are sequentially arranged in the second direction d2; a start time ton11 of the gate pulse signal $S_{HG11}$ of the 11-th scan line HG11 and an end time toff3 of the gate pulse signal $S_{HG3}$ of the 3-rd scan line HG3 overlap in time sequence; the transfer lines VG include the 3-rd transfer line VG3 and the 11-th transfer line VG11, which are respectively electrically connected to the 3-rd scan line HG3 and the 11-th scan line HG11; the pixel columns R include the 10-th pixel column R10, the 11-th pixel column R11, the 12-th pixel column R12, and the 13-th pixel column R13, which are sequentially arranged in the first direction d1; the data lines DL include the 10-th data line DL10, the 11-th data line DL11, the 12-th data line DL12, and the 13-th data line DL13, which are respectively electrically connected to the 10-th pixel column R10, the 11-th pixel column R11, the 12-th pixel column R12, and the 13-th pixel column R13; and the pixel array substrate 100 further includes a first common line VSS1b. In the top view of the pixel array substrate 100, the 3-rd transfer line VG3 is disposed between the 10-th data line DL10 and the 11-th data line DL11, the 11-th transfer line VG11 is disposed between the 11-th data line DL11 and the 12-th data line DL12, and the first common line VSS1b is disposed between the 12-th data line DL12 and the 13-th data line DL13.

Please refer to FIG. 5 and FIG. 6. In another part of the pixel array substrate 100 of this embodiment, n, x, and k described in the foregoing three paragraphs may also be respectively regarded as 8, 18, and 15 (that is, n=8, x=18, and k=15). Please refer to FIG. 5 and FIG. 6. The scan lines HG include the 10-th scan line HG10 to the 18-th scan line HG18, which are sequentially arranged in the second direction d2; a start time ton18 of the gate pulse signal $S_{HG18}$ of the 18-th scan line HG18 and an end time toff10 of the gate pulse signal $S_{HG10}$ of the 10-th scan line HG10 overlap in time sequence; the transfer lines VG include the 10-th transfer line VG10 and the 18-th transfer line VG18, which are respectively electrically connected to the 10-th scan line HG10 and the 18-th scan line HG18; the pixel columns R include the 14-th pixel column R14, the 15-th pixel column R15, the 16-th pixel column R16, and the 17-th pixel column R17, which are sequentially arranged in the first direction d1; the data lines DL include the 14-th data line DL14, the 15-th data line DL15, the 16-th data line DL16, and the 17-th data line DL17, which are respectively electrically connected to the 14-th pixel column R14, the 15-th pixel column R15, the 16-th pixel column R16, and the 17-th pixel column R17; and the pixel array substrate 100 further includes a first common line VSS1c. In the top view of the pixel array substrate 100, the 10-th transfer line VG10 is disposed between the 14-th data line DL14 and the 15-th data line DL15, the 18-th transfer line VG18 is disposed between the 15-th data line DL15 and the 16-th data line DL16, and the first common line VSS1c is disposed between the 16-th data line DL16 and the 17-th data line DL17.

Please refer to FIG. 5 and FIG. 6. In another part of the pixel array substrate 100 of this embodiment, n, x, and k described in the foregoing four paragraphs may also be respectively regarded as 8, 14, and 18 (that is, n=8, x=14, and k=18). Please refer to FIG. 5 and FIG. 6. The scan lines HG include the 6-th scan line HG6 to the 14-th scan line HG14, which are sequentially arranged in the second direction d2; a start time ton14 of the gate pulse signal $S_{HG14}$ of the 14-th scan line HG14 and an end time toff6 of the gate pulse signal $S_{HG6}$ of the 6-th scan line HG6 overlap in time sequence; the transfer lines VG include the 6-th transfer line VG6 and the 14-th transfer line VG14, which are respectively electrically connected to the 6-th scan line HG6 and the 14-th scan line HG14; the pixel columns R include the 17-th pixel column R17, the 18-th pixel column R18, the 19-th pixel column R19, and the 20-th pixel column R20, which are sequentially arranged in the first direction d1; the data lines DL include the 17-th data line DL17, the 18-th data line DL18, the 19-th data line DL19, and the 20-th data line DL20, which are respectively electrically connected to the 17-th pixel column R17, the 18-th pixel column R18, the 19-th pixel column R19, and the 20-th pixel column R20; and the pixel array substrate 100 further includes a first common line VSS1d. In the top view of the pixel array substrate 100, the 6-th transfer line VG6 is disposed between the 17-th data line DL17 and the 18-th data line DL18, the 14-th transfer line VG14 is disposed between the 18-th data line DL18 and the 19-th data line DL19, and the first common line VSS1d is disposed between the 19-th data line DL19 and the 20-th data line DL20.

Figures 9, 10:
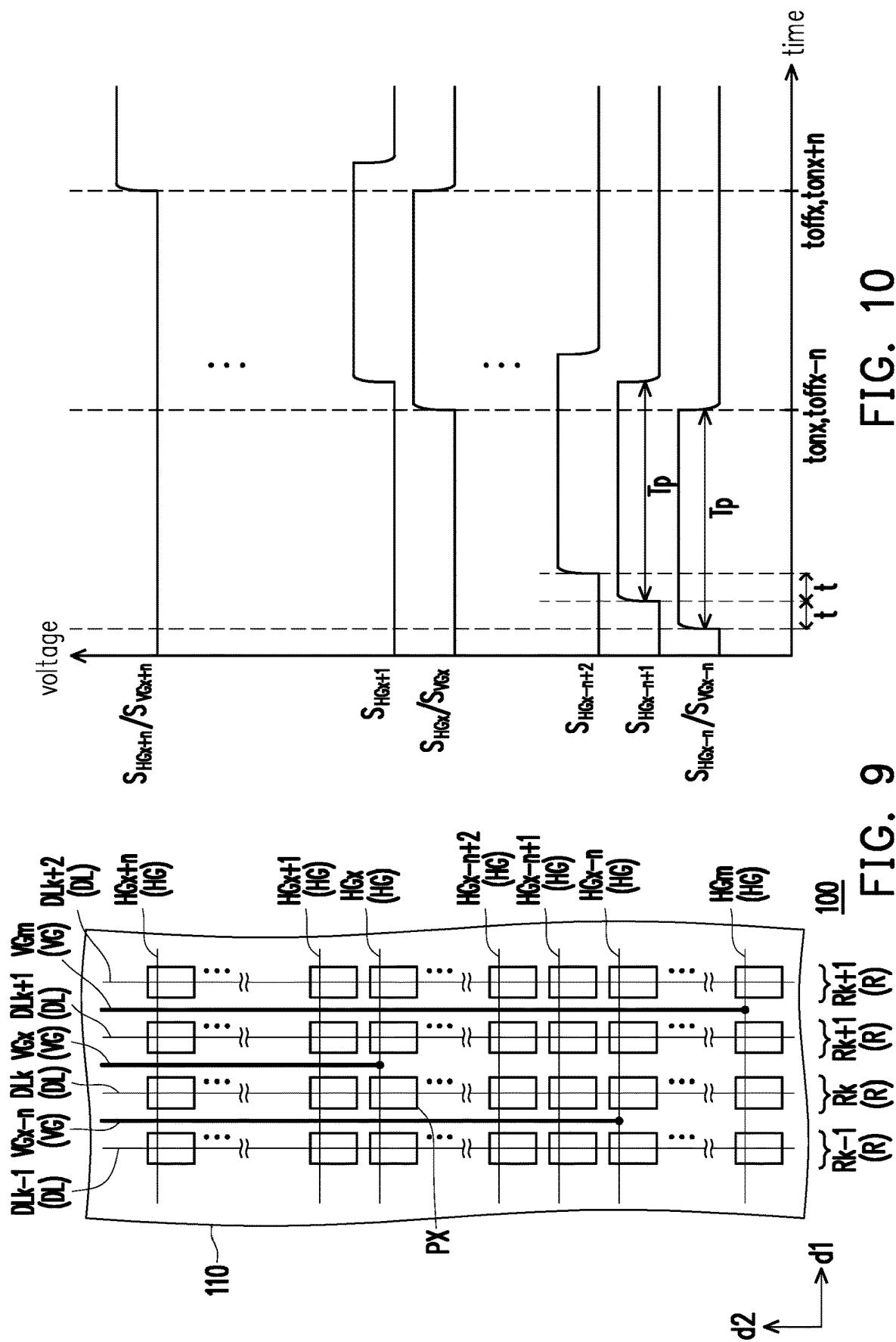
FIG. 9 is a schematic top view of a part of the pixel array substrate 100 according to an embodiment of the disclosure.
FIG. 10 shows multiple gate pulse signals $S_{HGx-n}$ to $S_{HGx+n}$ of an (x−n)-th scan line HGx−n to an (x+n)-th scan line HGx+n of FIG. 9.

FIG. 9 is a schematic top view of a part of the pixel array substrate 100 according to an embodiment of the disclosure.

FIG. 10 shows multiple gate pulse signals $S_{HGx-n}$ to $S_{HGx+n}$ of an (x−n)-th scan line HGx−n to an (x+n)-th scan line HGx+n of FIG. 9.

Please refer to FIG. 9 and FIG. 10. The scan lines HG include the (x−n)-th scan line HGx−n to the x-th scan line HGx, which are sequentially arranged in the second direction d2, where x is a positive integer greater than or equal to 2, and n is a positive integer and is less than x; the start time tonx of the gate pulse signal $S_{HGx}$ of the x-th scan line HGx and the end time toffx−n of the gate pulse signal $S_{HGx-n}$ of the (x−n)-th scan line HGx−n overlap in time sequence; the scan lines HG further include an m-th scan line HGm, where m is a positive integer greater than 2, and |x−m| is not equal to n; the transfer lines VG include the (x−n)-th transfer line VGx−n, the x-th transfer line VGx, and an m-th transfer line VGm, which are respectively electrically connected to the (x−n)-th scan line HGx−n, the x-th scan line HGx, and the m-th scan line HGm; the pixel columns R include the (k−1)-th pixel column Rk−1, the k-th pixel column Rk, the (k+1)-th pixel column Rk+1, and the (k+2)-th pixel column Rk+2, which are sequentially arranged in the first direction d1, where k is a positive integer greater than or equal to 2; and the data lines DL include the (k−1)-th data line DLk−1, the k-th data line DLk, the (k+1)-th data line DLk+1, and the (k+2)-th data line DLk+2, which are respectively electrically connected to the (k−1)-th pixel column Rk−1, the k-th pixel column Rk, the (k+1)-th pixel column Rk+1, and the (k+2)-th pixel column Rk+2. In the top view of the pixel array substrate 100, the (x−n)-th transfer line VGx−n is disposed between the (k−1)-th data line DLk−1 and the k-th data line DLk, the x-th transfer line VGx is disposed between the k-th data line DLk and the (k+1)-th data line DLk+1, and the m-th transfer line VGm is disposed between the (k+1)-th data line DLk+1 and the (k+2)-th data line DLk+2. The following is exemplified with FIG. 5 and FIG. 6.

Please refer to FIG. 5 and FIG. 6. In a part of the pixel array substrate 100 of this embodiment, n, x, k, m described in the foregoing paragraph may be respectively regarded as 8, 16, 21, and 4 (that is, n=8, x=16, k=21, and m=4). Please refer to FIG. 5 and FIG. 6. The scan lines HG include the 8-th scan line HG8 to the 16-th scan line HG16, which are sequentially arranged in the second direction d2; a start time ton16 of the gate pulse signal $S_{HG16}$ of the 16-th scan line HG16 and an end time toff8 of the gate pulse signal $S_{HG8}$ of the 8-th scan line HG8 overlap in time sequence; the scan lines HG further include the 4-th scan line HG4, where 4 is a positive integer greater than 2, and |16−4| is not equal to 8; the transfer lines VG include the 8-th transfer line VG8, the 16-th transfer line VG16, and the 4-th transfer line VG4, which are respectively electrically connected to the 8-th scan line HG8, the 16-th scan line HG16, and the 4-th scan line HG4; the pixel columns R include the 20-th pixel column R20, the 21-st pixel column R21, the 22-nd pixel column R22, and the 23-rd pixel column R23, which are sequentially arranged in the first direction d1; and the data lines DL include the 20-th data line DL20, the 21-st data line DL21, the 22-nd data line DL22, and the 23-rd data line DL23, which are respectively electrically connected to the 20-th pixel column R20, the 21-st pixel column R21, the 22-nd pixel column R22, and the 23-rd pixel column R23. In the top view of the pixel array substrate 100, the 8-th transfer line VG8 is disposed between the 20-th data line DL20 and the 21-st data line DL21, the 16-th transfer line VG16 is disposed between the 21-st data line DL21 and the 22-nd data line DL22, and the 4-th transfer line VG4 is disposed between the 22-nd data line DL22 and the 23-rd data line DL23.

In other words, in this embodiment, at a part of the pixel array substrate 100, start times (for example, ton8 and ton16) of the gate pulse signals (for example, $S_{VG8}$ and $S_{VG16}$) of the transfer lines VG (for example, the 8-th transfer line VG8 and the 16-th transfer line VG16) located on the left and right sides of the same data line DL (for example, the 21-st data line DL21) may differ by n times the time length t of the time delay (for example, 8t). However, in another part of the pixel array substrate 100, start times (for example, ton16 and ton4) of the gate pulse signals (for example, $S_{VG16}$ and $S_{VG4}$) of the transfer lines VG (for example, the 16-th transfer line VG16 and the 4-th transfer line VG4) located on the left and right sides of the same data line DL (for example, the 22-nd data line DL22) may not differ by n times t (for example, differ by 12t).

Figure 11:
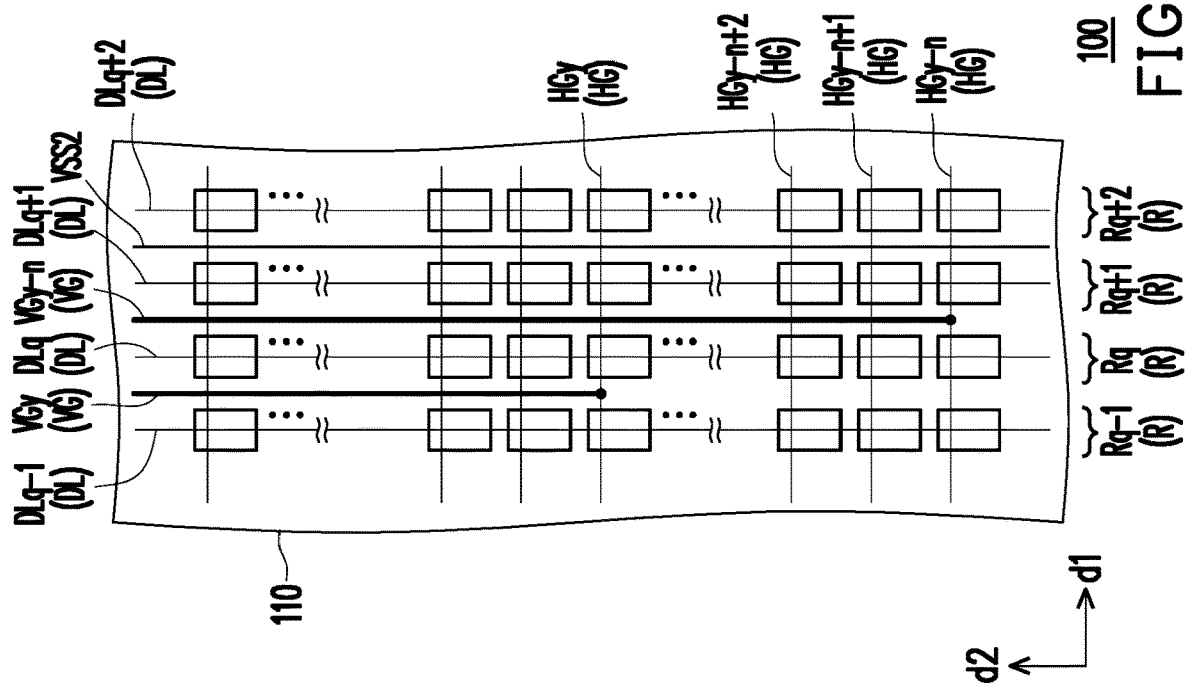
FIG. 11 is a schematic top view of a part of the pixel array substrate 100 according to an embodiment of the disclosure.

FIG. 11 is a schematic top view of a part of the pixel array substrate 100 according to an embodiment of the disclosure.

Figure 12:
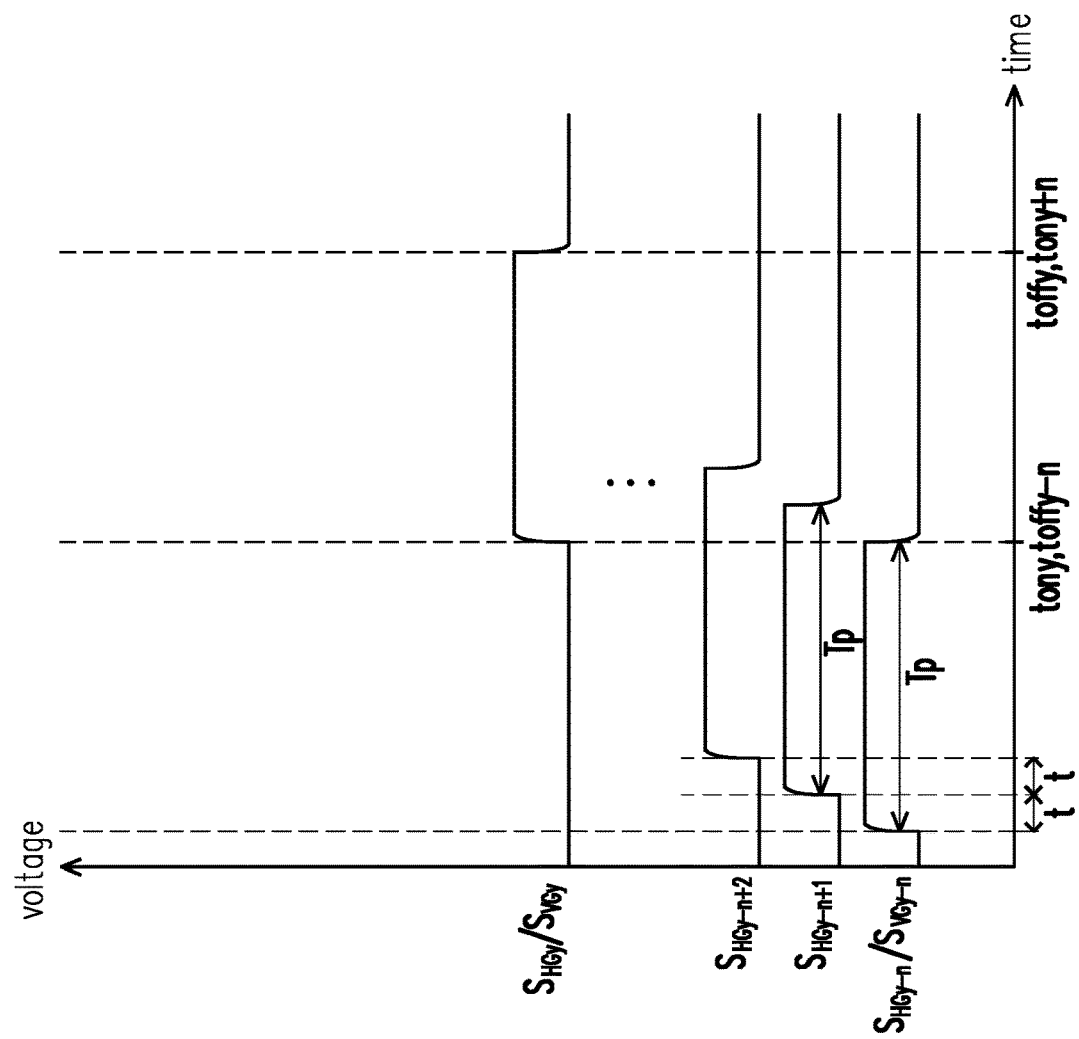
FIG. 12 shows multiple gate pulse signals $S_{HGy-n}$ to $S_{HGy}$ of a (y−n)-th scan line HGy−n to a y-th scan line HGy of FIG. 11.

FIG. 12 shows multiple gate pulse signals $S_{HGy-n}$ to $S_{HGy}$ of a (y−n)-th scan line HGy−n to a y-th scan line HGy of FIG. 11.

Please refer to FIG. 11. The scan lines HG include the (y−n)-th scan line HGy−n to the y-th scan line HGy, which are sequentially arranged in the second direction d2, where y is a positive integer greater than or equal to 2, and n is a positive integer and is less than y.

Please refer to FIG. 11 and FIG. 12. The (y−n)-th scan line HGy−n to the y-th scan line HGy respectively have the gate pulse signal $S_{HGy-n}$ to the gate pulse signal $S_{HGy}$. In detail, the (y−n)-th scan line HGy−n has the gate pulse signal $S_{HGy-n}$, the (y−n+1)-th scan line HGy−n+1 has the gate pulse signal $S_{HGy-n+1}$, and the (y−n+2)-th scan line HGy−n+2 has the gate pulse signal $S_{HGy-n+2}$, . . . , and the y-th scan line HGy has the gate pulse signal $S_{HGy}$.

Please refer to FIG. 11 and FIG. 12. The (y−n)-th scan line HGy−n to the y-th scan line HGy are sequentially turned on with a time delay. A time length of the time delay is t (shown in FIG. 12), and a pulse time length of each of the gate pulse signal $S_{HGy-n}$ to the gate pulse signal $S_{HGy}$ is Tp (shown in FIG. 12), where n=Tp/t. A start time tony of the gate pulse signal $S_{HGy}$ of the y-th scan line HGy and an end time toffy−n of the gate pulse signal $S_{HGy-n}$ of the (y−n)-th scan line HGy−n overlap in time sequence.

Please refer to FIG. 11. The transfer lines VG include a (y−n)-th transfer line VGy−n and a y-th transfer line VGy, which are respectively electrically connected to the (y−n)-th scan line HGy−n and the y-th scan line HGy. Please refer to FIG. 11 and FIG. 12. The (y−n)-th transfer line VGy−n and the y-th transfer line VGy respectively have the gate pulse signal $S_{VGy-n}$ and the gate pulse signal $S_{VGy}$. The gate pulse signal $S_{VGy-n}$ of the (y−n)-th transfer line VGy−n and the gate pulse signal $S_{VGy}$ of the y-th transfer line VGy are respectively the same as the gate pulse signal $S_{HGy-n}$ of the (y−n)-th scan line HGy−n and the gate pulse signal $S_{HGy}$ of the y-th scan line HGy.

Please refer to FIG. 11. The pixel columns R include a (q−1)-th pixel column Rq−1, a q-th pixel column Rq, a (q+1)-th pixel column Rq+1, and a (q+2)-th pixel column Rq+2, which are sequentially arranged in the first direction d1, where q is a positive integer greater than or equal to 2; the data lines DL include a (q−1)-th data line DLq−1, a q-th data line DLq, a (q+1)-th data line DLq+1, and a (q+2)-th data line DLq+2, which are respectively electrically connected to the (q−1)-th pixel column Rq−1, the q-th pixel column Rq, the (q+1)-th pixel column Rq+1, and the (q+2)-th pixel column Rq+2, where q is a positive integer greater than or equal to 2.

Please refer to FIG. 11. It is worth noting that in the top view of the pixel array substrate 100, the y-th transfer line VGy is disposed between the (q−1)-th data line DLq−1 and the q-th data line DLq, and the (y−n)-th transfer line VGy−n is disposed between the q-th data line DLq and the (q+1)-th data line DLq+1. The following is exemplified with FIG. 5 and FIG. 6.

Please refer to FIG. 5 and FIG. 6. In a part of the pixel array substrate 100 of this embodiment, n, y, and q corresponding to FIG. 11 and FIG. 12 described above may be respectively regarded as 8, 13, and 6 (that is, n=8, y=13, and q=6). Please refer to FIG. 5 and FIG. 6. In a part of the pixel array substrate 100 of this embodiment, the scan lines HG include the 5-th scan line HG5 to the 13-th scan line HG13, which are sequentially arranged in the second direction d2; and a start time ton13 of the gate pulse signal $S_{HG13}$ of the 13-th scan line HG13 and an end time toff5 of the gate pulse signal $S_{HG5}$ of the 5-th scan line HG5 overlap in time sequence. The transfer lines VG include the 5-th transfer line VG5 and the 13-th transfer line VG13, which are respectively electrically connected to the 5-th scan line HG5 and the 13-th scan line HG13. The 5-th transfer line VG5 and the 13-th transfer line VG13 respectively have the gate pulse signal $S_{VG5}$ and the gate pulse signal $S_{VG13}$. The gate pulse signal $S_{VG5}$ of the 5-th transfer line VG5 and the gate pulse signal $S_{VG13}$ of the 13-th transfer line VG13 are respectively the same as the gate pulse signal $S_{HG5}$ of the 5-th scan line HG5 and the gate pulse signal $S_{HG13}$ of the 13-th scan line HG13. The pixel columns R include the 5-th pixel column R5, the 6-th pixel column R6, the 7-th pixel column R7, and the 8-th pixel column R8, which are sequentially arranged in the first direction d1; and the data lines DL include the 5-th data line DL5, the 6-th data line DL6, the 7-th data line DL7, and the 8-th data line DL8, which are respectively electrically connected to the 5-th pixel column R5, the 6-th pixel column R6, the 7-th pixel column R7, and the 8-th pixel column R8.

Please refer to FIG. 5. It is worth noting that in the top view of the pixel array substrate 100, the 13-th transfer line VG13 is disposed between the 5-th data line DL5 and the 6-th data line DL6, and the 5-th transfer line VG5 is disposed between the 6-th data line DL6 and the 7-th data line DL7. Similarly, the 13-th transfer line VG13 and the 5-th transfer line VG5 are adjacent to the 6-th data line DL6 and are respectively located on the left and right sides of the 6-th data line DL6. Please refer to FIG. 5 and FIG. 6. Similarly, since the end time toff5 of the gate pulse signal $S_{VG5}$ of the 5-th transfer line VG5 and the start time ton13 of the gate pulse signal $S_{VG13}$ of the 13-th transfer line VG13 overlap in time sequence, the capacitive coupling effect between the 13-th transfer line VG13 and the 6-th data line DL6 may offset the capacitive coupling effect between the 5-th transfer line VG5 and the 6-th data line DL6, so that the potential of the pixel electrode 194 (shown in FIG. 3) of the pixel structure PX located in the 6-th pixel column R6 and electrically connected to the 13-th scan line HG13 is not prone to excessive deviation from the ideal value due to the transfer lines VG disposed on the left and right sides thereof. In this way, the pixel structure PX located in the 6-th pixel column R6 and electrically connected to the 13-th scan line HG13 is not prone to abnormal brightness (for example, over-brightness), thereby improving the issue of diagonal bright lines described in the prior art.

It should be noted that the two transfer lines VG located on the left and right sides of the same data line DL and sequentially arranged in the first direction d1 may offset the capacitance effects of the same data line DL, but the disclosure is not limited thereto. However, the disclosure does not limit that the start time of the gate pulse signal of one of the transfer lines VG arranged first in the first direction d1 must be earlier than the start time of the gate pulse signal of another transfer line VG arranged later. However, the disclosure also does not limit that the start time of the gate pulse signal of one of the transfer lines VG arranged first in the first direction d1 must be later than the start time of the gate pulse signal of another transfer line VG arranged later.

For example, in a part of the pixel array substrate 100 of FIG. 5, the two transfer lines (for example, the 1-st transfer line VG1 and the 9-th transfer line VG9) disposed on the left and right sides of the same data line (for example, the 2-nd data line DL2) and sequentially arranged in the first direction d1 may offset the capacitance effects of the same data line (for example, the 2-nd data line DL2). The start time of the gate pulse signal of one of the transfer lines VG arranged first in the first direction d1 may be earlier than the start time of the gate pulse signal of another transfer line VG arranged later (for example, a start time ton1 of the gate pulse signal $S_{VG1}$ of the 1-st transfer line VG1 arranged first in the first direction d1 may be earlier than the start time ton9 of the gate pulse signal $S_{VG9}$ of the 9-th transfer line VG9 arranged later). However, in another part of the pixel array substrate 100 of FIG. 5, the transfer lines (for example, the 13-th transfer line VG13 and the 5-th transfer line VG5) disposed on the left and right sides of the same data line (for example, the 6-th data line DL6) and sequentially arranged in the first direction d1 may offset the capacitance effects of the same data line (for example, the 6-th data line DL6). The start time of the gate pulse signal of one of the transfer lines VG arranged first in the first direction d1 may be later than the start time of the gate pulse signal of another transfer line VG arranged later (for example, the start time ton13 of the gate pulse signal $S_{VG13}$ of the 13-th transfer line VG13 arranged first in first direction d1 may be later than a start time ton5 of the gate pulse signal $S_{VG5}$ of the 5-th transfer line VG5 arranged later).

Please refer to FIG. 11 and FIG. 12 again. The pixel array substrate 100 further includes a second common line VSS2. In the top view of the pixel array substrate 100, the y-th transfer line VGy is disposed between the (q−1)-th data line DLq−1 and the q-th data line DLq, the (y−n)-th transfer line VGy−n is disposed between the q-th data line DLq and the (q+1)-th data line DLq+1, and the second common line VSS2 is disposed between the (q+1)-th data line DLq+1 and the (q+2)-th data line DLq+2. The following is exemplified with FIG. 5 and FIG. 6.

Please refer to FIG. 5. In a part of the pixel array substrate 100 of this embodiment, n, y, and q corresponding to FIG. 11 and FIG. 12 described above may be respectively regarded as 8, 13, and 6 (that is, n=8, y=13, and q=6). Please refer to FIG. 5. In the top view of the pixel array substrate 100, the 13-th transfer line VG13 is disposed between the 5-th data line DL5 and the 6-th data line DL6, the 5-th transfer line VG5 is disposed between the 6-th data line DL6 and the 7-th data line DL7, and the second common line VSS2 is disposed between the 7-th data line DL7 and the 8-th data line DL8.

FIG. 13 is a schematic top view of a part of the pixel array substrate 100 according to an embodiment of the disclosure.

FIG. 14 shows multiple gate pulse signals $S_{HGy-n}$ to $S_{HGy}$ of a (y−n)-th scan line HGy−n to a y-th scan line HGy of FIG. 13.

Please refer to FIG. 13 and FIG. 14. The scan lines HG include the (y−n)-th scan line HGy−n to the y-th scan line HGy, which are sequentially arranged in the second direction d2, where y is a positive integer greater than or equal to 2, and n is a positive integer and is less than y; the start time tony of the gate pulse signal $S_{HGy}$ of the y-th scan line HGy and the end time toffy−n of the gate pulse signal $S_{HGy-n}$ of the (y−n)-th scan line HGy−n overlap in time sequence; the scan lines HG further include a p-th scan line HGp; the transfer lines VG include the (y−n)-th transfer line VGy−n and the y-th transfer line VGy, which are respectively electrically connected to the (y−n)-th scan line HGy−n and the y-th scan line HGy; the transfer lines VG further include a p-th transfer line VGp, which is electrically connected to the p-th scan line HGp; the pixel columns R include the (q−1)-th pixel column Rq−1, the q-th pixel column Rq, the (q+1)-th pixel column Rq+1, and the (q+2)-th pixel column Rq+2, which sequentially arranged in the first direction d1, where q is a positive integer greater than or equal to 2; and the data lines DL include the (q−1)-th data line DLq−1, the q-th data line DLq, the (q+1)-th data line DLq+1, and the (q+2)-th data line DLq+2, which are respectively electrically connected to the (q−1)-th pixel column Rq−1, the q-th pixel column Rq, the (q+1)-th pixel column Rq+1, and the (q+2)-th pixel column Rq+2. In the top view of the pixel array substrate 100, the y-th transfer line VGy is disposed between the (q−1)-th data line DLq−1 and the q-th data line DLq, the (y−n)-th transfer line VGy−n is disposed between the q-th data line DLq and the (q+1)-th data line DLq+1, and the p-th transfer line VGp is disposed between the (q+1)-th data line DLq+1 and the (q+2)-th data line DLq+2. In particular, p is a positive integer greater than 2, and |y−p| is not equal to n. The following is exemplified with FIG. 5 and FIG. 6.

Please refer to FIG. 5 and FIG. 6. In a part of the pixel array substrate 100 of this embodiment, n, y, q, and p corresponding to FIG. 13 and FIG. 14 described above may be respectively regarded as 8, 15, 9, and 3 (that is, n=8, y=15, q=9, and p=3). Please refer to FIG. 5 and FIG. 6. In the top view of the pixel array substrate 100, the scan lines HG include the 7-th scan line HG7 to the 15-th scan line HG15, which are sequentially arranged in the second direction d2; a start time ton15 of the gate pulse signal $S_{HG15}$ of the 15-th scan line HG15 and an end time toff7 of the gate pulse signal $S_{HG7}$ of the 7-th scan line HG7 overlap in time sequence; the scan lines HG further include the 3-rd scan line HG3; the transfer lines VG include the 7-th transfer line VG7 and the 15-th transfer line VG15, which are respectively electrically connected to the 7-th scan line HG7 and the 15-th scan line HG15; the transfer lines VG further include the 3-rd transfer line VG3, which is electrically connected to the 3-rd scan line HG3; the pixel columns R include the 8-th pixel column R8, the 9-th pixel column R9, the 10-th pixel column R10, and the 11-th pixel column R11, which are sequentially arranged in the first direction d1; and the data lines DL include the 8-th data line DL8, the 9-th data line DL9, the 10-th data line DL10, and the 11-th data line DL11, which are respectively electrically connected to the 8-th pixel column R8, the 9-th pixel column R9, the 10-th pixel column R10, and the 11-th pixel column R11. In the top view of the pixel array substrate 100, the 15-th transfer line VG15 is disposed between the 8-th data line DL8 and the 9-th data line DL9, the 7-th transfer line VG7 is disposed between the 9-th data line DL9 and the 10-th data line DL10, and the 3-rd transfer line VG3 is disposed between the 10-th data line DL10 and the 11-th data line DL11. In particular, 3 is a positive integer greater than 2, and |15−3| is not equal to 8.

In other words, in this embodiment, in a part of the pixel array substrate 100, the start times (for example, ton15 and ton7) of the gate pulse signals (for example, $S_{VG15}$ and $S_{VG7}$) of the two transfer lines VG (for example, the 15-th transfer line VG15 and the 7-th transfer line VG7) located on the left and right sides of the same data line DL (for example, the 9-th data line DL9) may differ by n times the time length t of the time delay (for example, 8t). However, in another part of the pixel array substrate 100, the start times (for example, ton7 and ton3) of the gate pulse signals (for example, $S_{VG7}$ and $S_{VG3}$) of the transfer lines VG (for example, the 7-th transfer line VG7 and the 3-rd transfer line VG3) located on the left and right sides of the same data line DL (for example, the 10-th data line DL10) may not differ by n times t (for example, differ by 4t).

In the foregoing description, Tp/t=n=8 is taken as an example. However, the disclosure is not limited thereto. In other embodiments, Tp/t=n, and n may also be other positive integers other than 8. The following is exemplified with FIG. 15 and FIG. 16.

Figure 15:
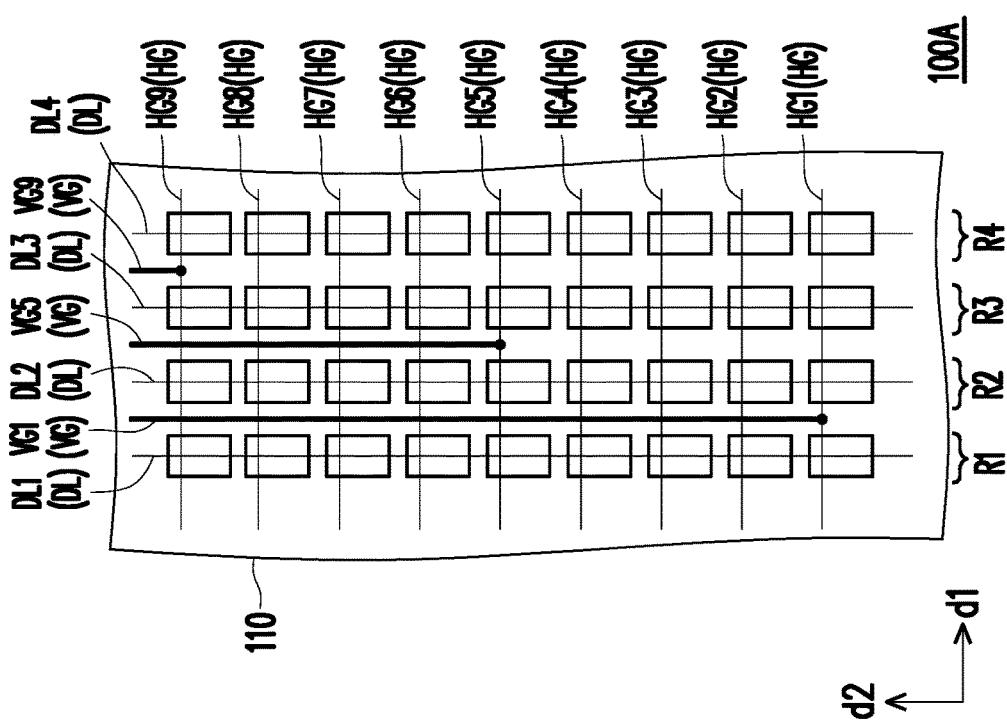
FIG. 15 is a schematic top view of a part of a pixel array substrate 100A according to an embodiment of the disclosure.

FIG. 15 is a schematic top view of a part of a pixel array substrate 100A according to an embodiment of the disclosure.

Figure 16:
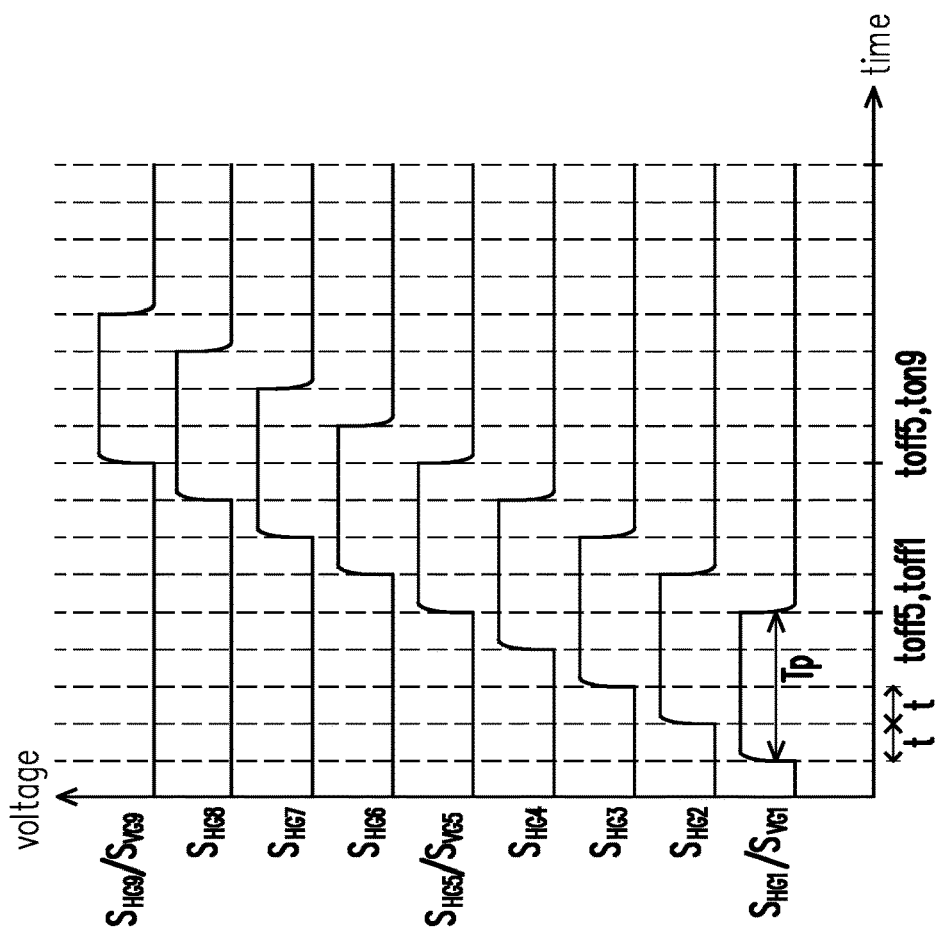
FIG. 16 shows multiple gate pulse signals $S_{HG1}$ to $S_{HG9}$ of a 1-st scan line HG1 to a 9-th scan line HG9 of FIG. 15.

FIG. 16 shows multiple gate pulse signals $S_{HG1}$ to $S_{HG9}$ of a 1-st scan line HG1 to a 9-th scan line HG9 of FIG. 15.

Please refer to FIG. 1 and FIG. 2 again. The scan lines HG include the (x−n)-th scan line HGx−n to the (x+n)-th scan line HGx+n, which are sequentially arranged in the second direction d2, where x is a positive integer greater than or equal to 2, and n is a positive integer and is less than x; the start time tonx of the gate pulse signal $S_{HGx}$ of the x-th scan line HGx and the end time toffx−n of the gate pulse signal $S_{HGx-n}$ of the (x−n)-th scan line HG overlap in time sequence; the end time toffx of the gate pulse signal $S_{HGx}$ of the x-th scan line HGx and the start time tonx+n of the gate pulse signal $S_{HGx+n}$ of the (x+n)-th scan line HGx+n overlap in time sequence; the transfer lines VG include the (x−n)-th transfer line VGx−n, the x-th transfer line VGx, and the (x+n)-th transfer line VGx+n, which are respectively electrically connected to the (x−n)-th scan line HGx−n, the x-th scan line HGx, and the (x+n)-th scan line HGx+n; the pixel columns R include the (k−1)-th pixel column Rk−1, the k-th pixel column Rk, the (k+1)-th pixel column Rk+1, and the (k+2)-th pixel column Rk+2, which are sequentially arranged in the first direction d1, where k is a positive integer greater than or equal to 2; and the data lines DL include the (k−1)-th data line DLk−1, the k-th data line DLk, the (k+1)-th data line DLk+1, and the (k+2)-th data line DLk+2, which are respectively electrically connected to the (k−1)-th pixel column Rk−1, the k-th pixel column Rk, the (k+1)-th pixel column Rk+1, and the (k+2)-th pixel column Rk+2. In the top view of the pixel array substrate 100, the (x−n)-th transfer line VGx−n is disposed between the (k−1)-th data line DLk−1 and the k-th data line DLk, the x-th transfer line VGx is disposed between the k-th data line DLk and the (k+1)-th data line DLk+1, and the (x+n)-th transfer line VGx+n is disposed between the (k+1)-th data line DLk+1 and the (k+2)-th data line DLk+2. The following is exemplified with FIG. 15 and FIG. 16.

In a part of the pixel array substrate 100A of this embodiment, n, x, and k described in the foregoing paragraph may be respectively regarded as 4, 5, and 2 (that is, n=4, x=5, and k=2). Please refer to FIG. 15 and FIG. 16. The scan lines HG include the 1-st scan line HG1 to the 9-th scan line HG9, which are sequentially arranged in the second direction d2; the start time ton5 of the gate pulse signal $S_{HG5}$ of the 5-th scan line HG5 and the end time toff1 of the gate pulse signal $S_{HG1}$ of the 1st scan line HG1 overlap in time sequence; the end time toff5 of the gate pulse signal $S_{HG5}$ of the 5-th scan line HG5 and the start time ton9 of the gate pulse signal $S_{HG9}$ of the 9-th scan line HG9 overlap in time sequence; the transfer lines VG include the 1-st transfer line VG1, the 5-th transfer line VG5, and the 9-th transfer line VG9, which are respectively electrically connected to the 1-st scan line HG1, the fifth scan line HG5, and the 9-th scan line HG9; the pixel columns R include the 1-st pixel column R1, the 2-nd pixel column R2, the 3-rd pixel column R3, and the 4-th pixel column R4, which are sequentially arranged in the first direction d1; and the data lines DL include the 1-st data line DL1, the 2-nd data line DL2, the 3-rd data line DL3, and the 4-th data line DL4, which are respectively electrically connected to the 1-st pixel column R1, the 2-nd pixel column R2, the 3-rd pixel column R3, and the 4-th pixel column R4. In the top view of the pixel array substrate 100, the 1-st transfer line VG1 is disposed between the 1-st data line DL1 and the 2-nd data line DL2, the 5-th transfer line VG5 is disposed between the 2-nd data line DL2 and the 3-rd data line DL3, and the 9-th transfer line VG9 is disposed between the 3-rd data line DL3 and the 4-th data line DL4.

Figure 17:
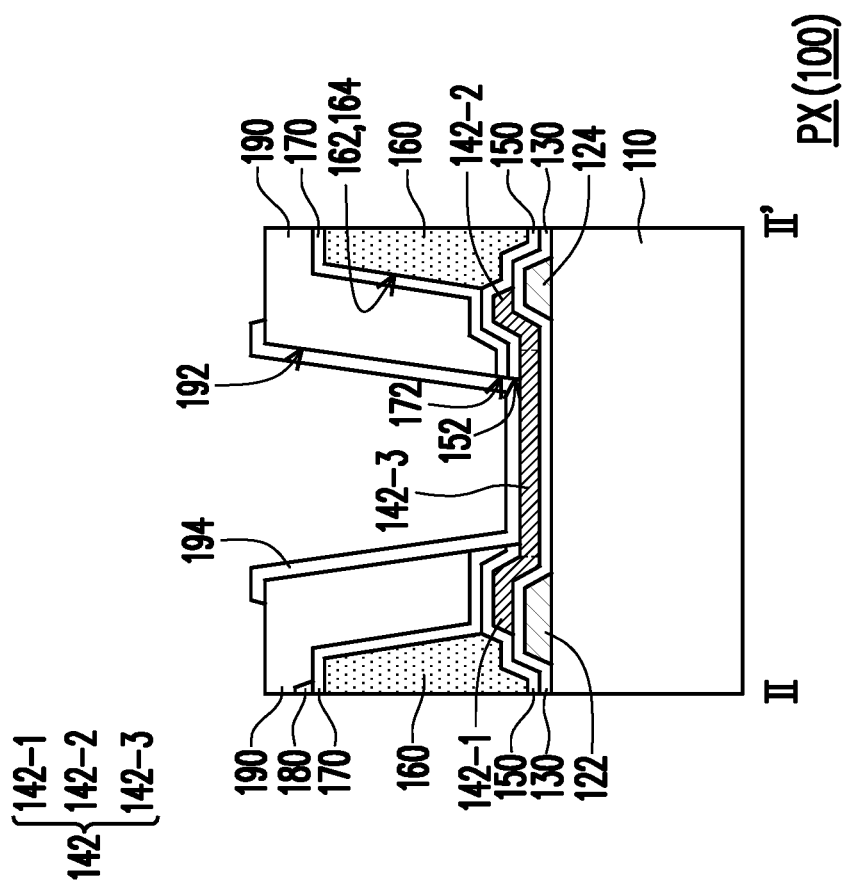
FIG. 17 is a schematic cross-sectional view of the pixel structure PX of the pixel array substrate 100 according to an embodiment of the disclosure.

FIG. 17 is a schematic cross-sectional view of the pixel structure PX of the pixel array substrate 100 according to an embodiment of the disclosure. FIG. 17 corresponds to a section line of II-II' FIG. 3.

The specific structure of the pixel structure PX according to an embodiment of the disclosure will be exemplified below with FIG. 3 and FIG. 17. The pixel structure PX may be selectively applied to the pixel array substrate 100 or 100A.

Please refer to FIG. 3 and FIG. 17. In addition to the thin film transistor T and the pixel electrode 194 electrically connected to the thin film transistor T, the pixel structure PX further includes a first common electrode 122. The first common electrode 122 and the pixel electrode 194 partially overlap to form a storage capacitor.

In this embodiment, the pixel structure PX may selectively include a second common electrode 124, which is separated from the first common electrode 122. Please refer to FIG. 3. In the top view of the pixel array substrate 100, the first common electrode 122, the second common electrode 124, and the scan lines HG are arranged in the second direction d2 and are separated from each other.

For example, in this embodiment, the first common electrode 122, the second common electrode 124, and the scan lines HG may belong to the first conductive layer and are separated from each other, the gate Tc of the thin film transistor T may belong to the first conductive layer, and the gate Tc of thin film transistor T and the scan lines HG may be directly connected. The source Ta and the drain Tb of the thin film transistor T may belong to the second conductive layer and are separated from each other, the data lines DL may belong to the second conductive layer, and the data lines DL and the source Ta of the thin film transistor T may be directly connected, but the disclosure is not limited thereto.

Please refer to FIG. 3 and FIG. 17. The pixel structure PX further includes a conductive pattern 142, which is electrically connected to the thin film transistor T. Specifically, the conductive pattern 142 is electrically connected to the drain Tb of the thin film transistor T. For example, in this embodiment, the conductive pattern 142 and the drain Tb of the thin film transistor T may belong to the same second conductive layer and may be directly connected, but the disclosure is not limited thereto.

The conductive pattern 142 has a first portion 142-1, which is disposed on the first common electrode 122. Specifically, the conductive pattern 142 is disposed on the insulating layer 130, and the first portion 142-1 of the conductive pattern 142 and the first common electrode 122 overlap. In this embodiment, the conductive pattern 142 further has a second portion 142-2, which is disposed on the second common electrode 124. Specifically, the conductive pattern 142 is disposed on the insulating layer 130, and the second portion 142-2 of the conductive pattern 142 and the second common electrode 124 overlap. In this embodiment, the conductive pattern 142 further has a third portion 142-3, which is connected between the first portion 142-1 and the second portion 142-2. In the top view of the pixel array substrate 100, the third portion 142-3 of the conductive pattern 142 is located between the first common electrode 122 and the second common electrode 124, and does not overlap with the first common electrode 122 and the second common electrode 124.

Please refer to FIG. 3 and FIG. 17, the pixel structure PX further includes a first insulating layer 150, which is disposed on the conductive pattern 142 and has an opening 152 overlapping with the conductive pattern 142. In this embodiment, the opening 152 of the first insulating layer 150 may overlap with the third portion 142-3 of the conductive pattern 142. For example, in this embodiment, the material of the first insulating layer 150 may be an inorganic material (for example, silicon oxide, silicon nitride, silicon oxynitride, or a stacked layer of at least two of the foregoing materials), an organic material, or a combination of the foregoing materials.

Please refer to FIG. 3 and FIG. 17. The pixel structure PX further includes a color filter pattern 160, which is disposed on the first insulating layer 150 and has an opening 162 overlapping with the conductive pattern 142. Please refer to FIG. 3. For example, in the top view of the pixel array substrate 100, the opening 152 of the first insulating layer 150 may be located within the opening 162 of the color filter pattern 160.

Please refer to FIG. 3 and FIG. 17. The pixel structure PX further includes a second insulating layer 170, which is disposed on the color filter pattern 160 and has an opening 172 overlapping with the conductive pattern 142. For example, in this embodiment, the material of the second insulating layer 170 may be an inorganic material (for example, silicon oxide, silicon nitride, silicon oxynitride, or a stacked layer of at least two of the foregoing materials), an organic material, or a combination of the foregoing materials.

In this embodiment, the pixel array substrate 100 may selectively include a transparent conductive layer 180, which is disposed on the second insulating layer 170. The transparent conductive layer 180 is disposed between the film layer to which the transfer lines VG belong and the film layer to which the pixel electrode 194 belongs to shield the pixel electrode 194, so that the potential of the pixel electrode 194 is not easily affected by the transfer lines VG. For example, in this embodiment, the material of the transparent conductive layer 180 may include metal oxides, such as indium tin oxide, indium zinc oxide, aluminum tin oxide, aluminum zinc oxide, indium germanium zinc oxide, other suitable oxides, or stacked layers of at least two of the foregoing, but the disclosure is not limited thereto.

The pixel electrode 194 is disposed on the second insulating layer 170 and is electrically connected to the conductive pattern 142 through the opening 152 of the first insulating layer 150 and the opening 172 of the second insulating layer 170. For example, in this embodiment, the pixel structure PX may selectively include a third insulating layer 190, which is disposed on the second insulating layer 170 and covers the transparent conductive layer 180. The third insulating layer 190 has an opening 192, which overlaps with the conductive pattern 142. The pixel electrode 194 may be disposed on the third insulating layer 190 and electrically contact the third portion 142-3 of the conductive pattern 142 through the opening 192 of the third insulating layer 190, the opening 172 of the second insulating layer 170, and the opening 152 of the first insulating layer 150, but the disclosure is not limited thereto.

In this embodiment, the opening 192 of the third insulating layer 190, the opening 172 of the second insulating layer 170, and the opening 152 of the first insulating layer 150 may be located on the third portion 142-3 of the conductive pattern 142. The opening 192 of the third insulating layer 190, the opening 172 of the second insulating layer 170, and the opening 152 of the first insulating layer 150 may be substantially aligned, but the disclosure is not limited thereto.

In this embodiment, in the top view of the pixel array substrate 100, the opening 152 of the first insulating layer 150 and the opening 172 of the second insulating layer 170 may be located between the first common electrode 122 and the second common electrode 124 and do not overlap with the first common electrode 122 and the second common electrode 124.

Please refer to FIG. 3. It is worth noting that in the top view of the pixel array substrate 100, the first portion 142-1 of the conductive pattern 142 covers all edges 122e of the first common electrode 122 located within the opening 162 of the color filter pattern 160. Please refer to FIG. 3 and FIG. 17. In other words, within the opening 162 of the color filter pattern 160, there is no overlap or intersection between edges 142e of the conductive pattern 142 and the edges 122e of the first common electrode 122, and the first common electrode 122, the conductive pattern 142, and the insulating layer 130 sandwiched therebetween cannot easily form a stacked structure with steep sidewalls. Near the edges 122e of the first common electrode 122, the second insulating layer 170 does not need to be formed on a stacked structure with steep sidewalls and can be well disposed on the first insulating layer 150. As such, the second insulating layer 170 can well cover the color filter pattern 160 and a sidewall 164 thereof, so that the gas within the color filter pattern 160 cannot easily pass through the second insulating layer 170 to be leaked out of the pixel array substrate 100, which causes the issue of bubbles in a display panel.

Please refer to FIG. 3. In this embodiment, in the top view of the pixel array substrate 100, the second portion 142-2 of the conductive pattern 142 covers all edges 124e of the second common electrode 124 located within the opening 162 of the color filter pattern 160. Please refer to FIG. 3 and FIG. 17. In other words, in the opening 162 of the color filter pattern 160, there is no overlap or intersection between the edges 142e of the conductive pattern 142 and the edges 124e of the second common electrode 124, and the second common electrode 124, the conductive pattern 142, and the insulating layer 130 sandwiched therebetween cannot easily form a stacked structure with steep sidewalls. Near the edges 124e of the second common electrode 124, the second insulating layer 170 does not need to be formed on a stacked structure with steep sidewalls and can be well disposed on the first insulating layer 150. As such, the second insulating layer 170 can well cover the color filter pattern 160 and the sidewall 164 thereof, so that the gas within the color filter pattern 160 cannot easily pass through the second insulating layer 170 to be leaked out of the pixel array substrate 100, which causes the issue of bubbles in the display panel.

Figure 18:
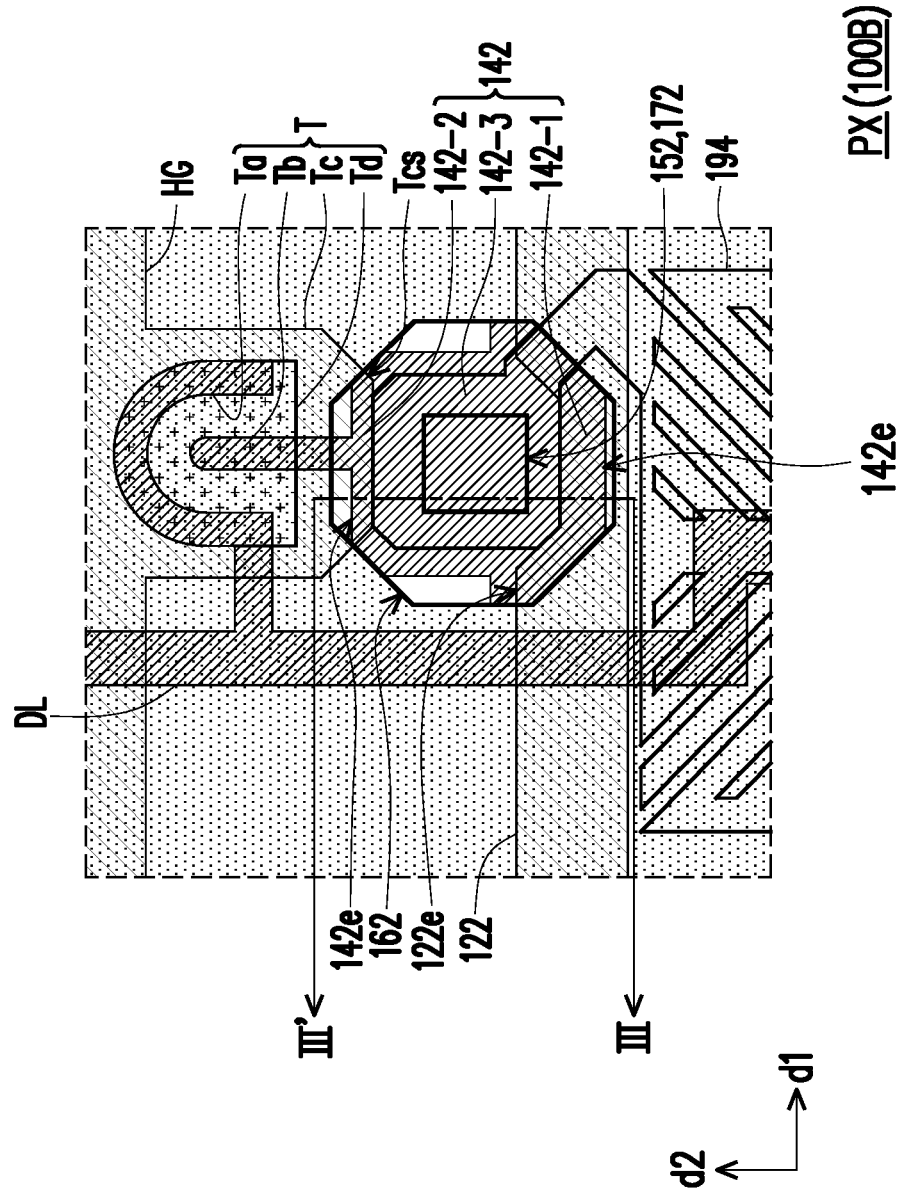
FIG. 18 is a schematic top view of a layout of a pixel structure PX of a pixel array substrate 100B according to an embodiment of the disclosure.

FIG. 18 is a schematic top view of a layout of a pixel structure PX of a pixel array substrate 100B according to an embodiment of the disclosure.

Figure 19:
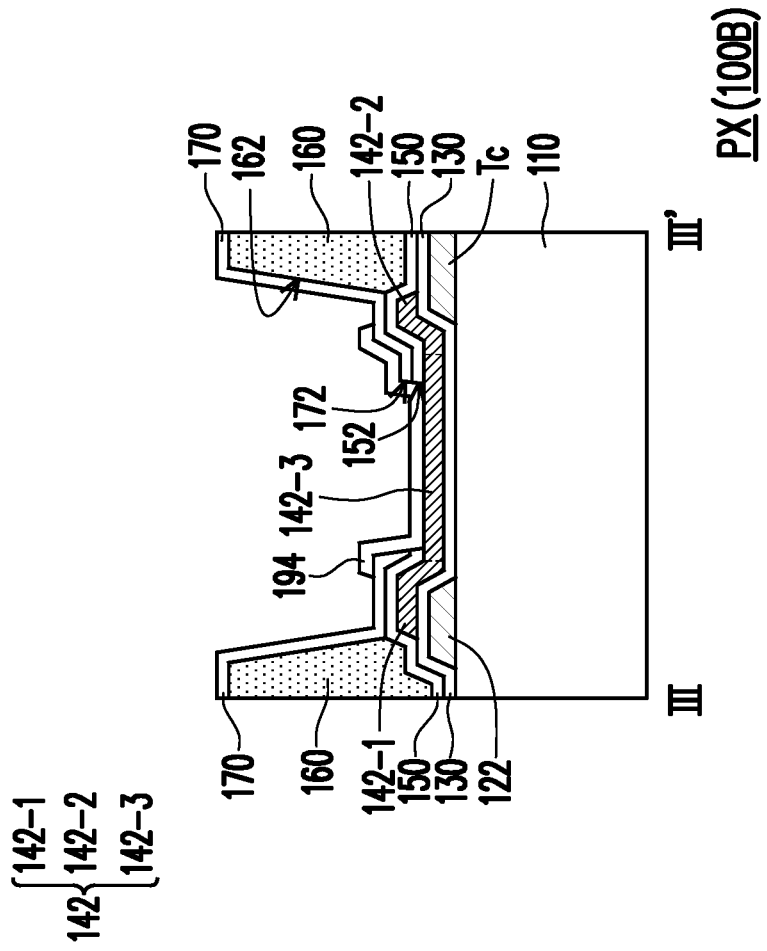
FIG. 19 is a schematic cross-sectional view of the pixel structure PX of the pixel array substrate 100B according to an embodiment of the disclosure.

FIG. 19 is a schematic cross-sectional view of the pixel structure PX of the pixel array substrate 100B according to an embodiment of the disclosure. FIG. 19 corresponds to a section line III-III' of FIG. 18.

The pixel structure PX of FIG. 18 and FIG. 19 may also be selectively applied to the pixel array substrate 100 or 100A.

The pixel structure PX of FIG. 18 and FIG. 19 is similar to the pixel structure PX of FIG. 3 and FIG. 17, so the same or similar elements are indicated by the same or similar reference numerals. The differences between the two are explained below. Please refer to the foregoing description for the same or similar parts of the two, which will not be repeated here.

Please refer to FIG. 18 and FIG. 19. In this embodiment, the pixel structure PX may not include the second common electrode 124 in the embodiment of FIG. 3 and FIG. 17. In addition, the pixel structure PX may not include the third insulating layer 190 and the transparent conductive layer 180 in the embodiment of FIG. 3 and FIG. 17.

Please refer to FIG. 18 and FIG. 19. In this embodiment, the second portion 142-2 of the conductive pattern 142 may be disposed on the gate Tc of the thin film transistor T. Please refer to FIG. 18. In the top view of the pixel array substrate 100B, the second portion 142-2 of the conductive pattern 142 may cover all edges Tcs of the gate Tc located within the opening 162 of the color filter pattern 160.

In the top view of the pixel array substrate 100B, the third portion 142-3 of the conductive pattern 142 is located between the first common electrode 122 and the gate Tc, the opening 152 of the first insulating layer 150 and the opening 172 of the second insulating layer 170 are located on the third portion 142-3 of the conductive pattern 142, and the opening 152 of the first insulating layer 150 and the opening 172 of the second insulating layer 170 do not overlap with the first common electrode 122 and the gate Tc.

Figure 20:
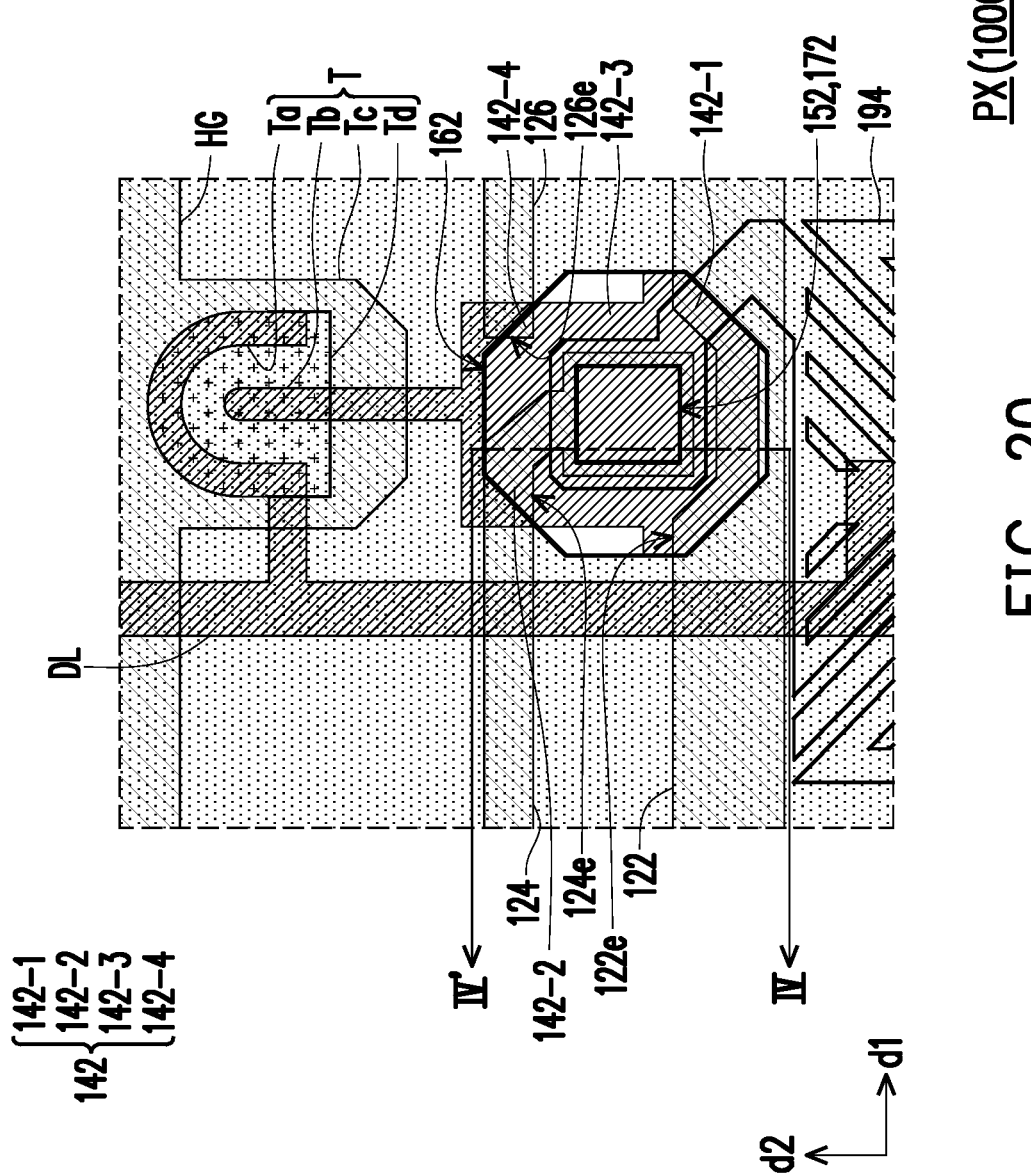
FIG. 20 is a schematic top view of a layout of a pixel structure PX of a pixel array substrate 100C according to an embodiment of the disclosure.

FIG. 20 is a schematic top view of a layout of a pixel structure PX of a pixel array substrate 100C according to an embodiment of the disclosure.

Figure 21:
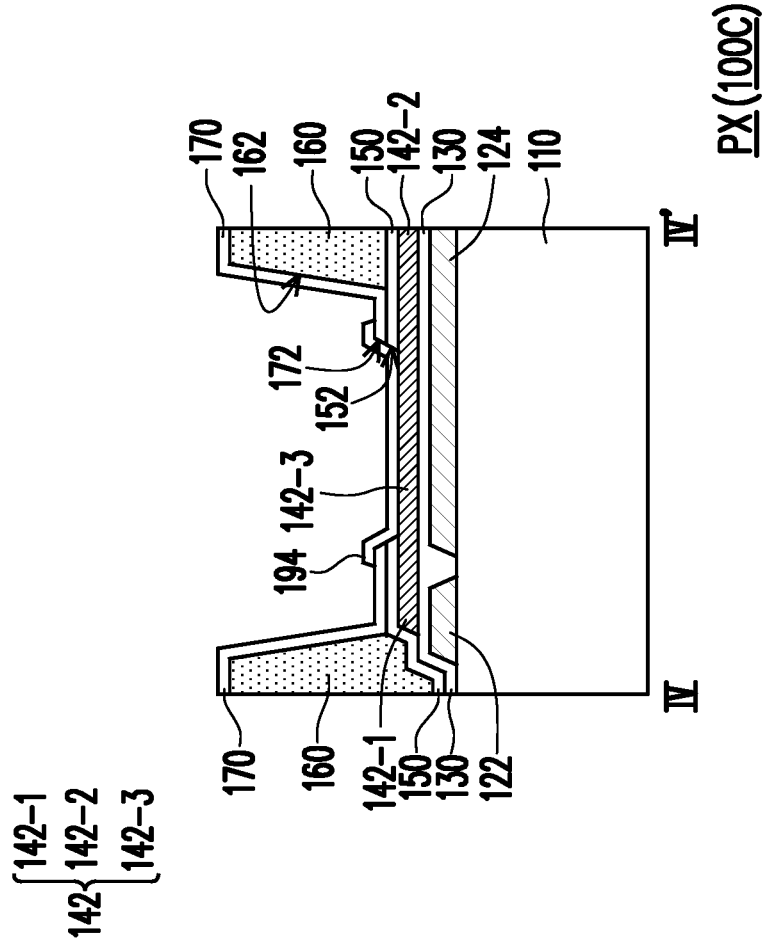
FIG. 21 is a schematic cross-sectional view of the pixel structure PX of the pixel array substrate 100C according to an embodiment of the disclosure.

FIG. 21 is a schematic cross-sectional view of the pixel structure PX of the pixel array substrate 100C according to an embodiment of the disclosure. FIG. 21 corresponds to a section line IV-IV' of FIG. 20.

The pixel structure PX of FIG. 20 and FIG. 21 may also be selectively applied to the pixel array substrate 100 or 100A.

The pixel structure PX of FIG. 20 and FIG. 21 is similar to the pixel structure PX of FIG. 3 and FIG. 17, so the same or similar elements are indicated by the same or similar reference numerals. The differences between the two are explained below. Please refer to the foregoing description for the same or similar parts of the two, which will not be repeated here.

The difference from the pixel structure PX of FIG. 3 and FIG. 17 is that in the embodiment of FIG. 20 and FIG. 21, the pixel structure PX further includes a third common electrode 126, which is separated from the first common electrode 122 and the second common electrode 124. In this embodiment, the third common electrode 126 may belong to the first conductive layer. Please refer to FIG. 20. The conductive pattern 142 further includes a fourth portion 142-4, which is disposed on the third common electrode 126. In the top view of the pixel array substrate 100C, the fourth portion 142-4 of the conductive pattern 142 covers all edges 126e of the third common electrode 126 located within the opening 162 of the color filter pattern 160.

Figure 22:
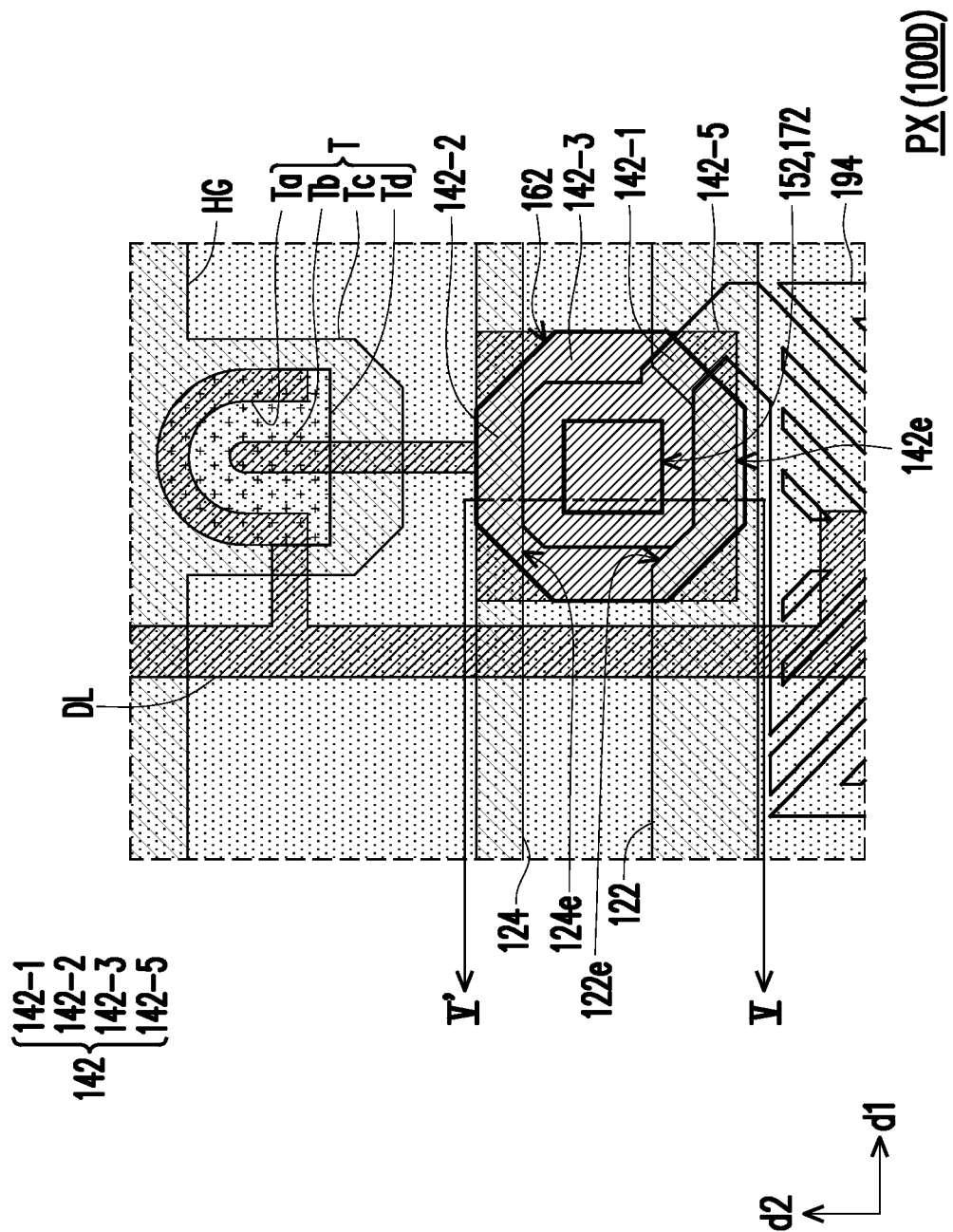
FIG. 22 is a schematic top view of a layout of a pixel structure PX of a pixel array substrate 100D according to an embodiment of the disclosure.

FIG. 22 is a schematic top view of a layout of a pixel structure PX of a pixel array substrate 100D according to an embodiment of the disclosure.

Figure 23:
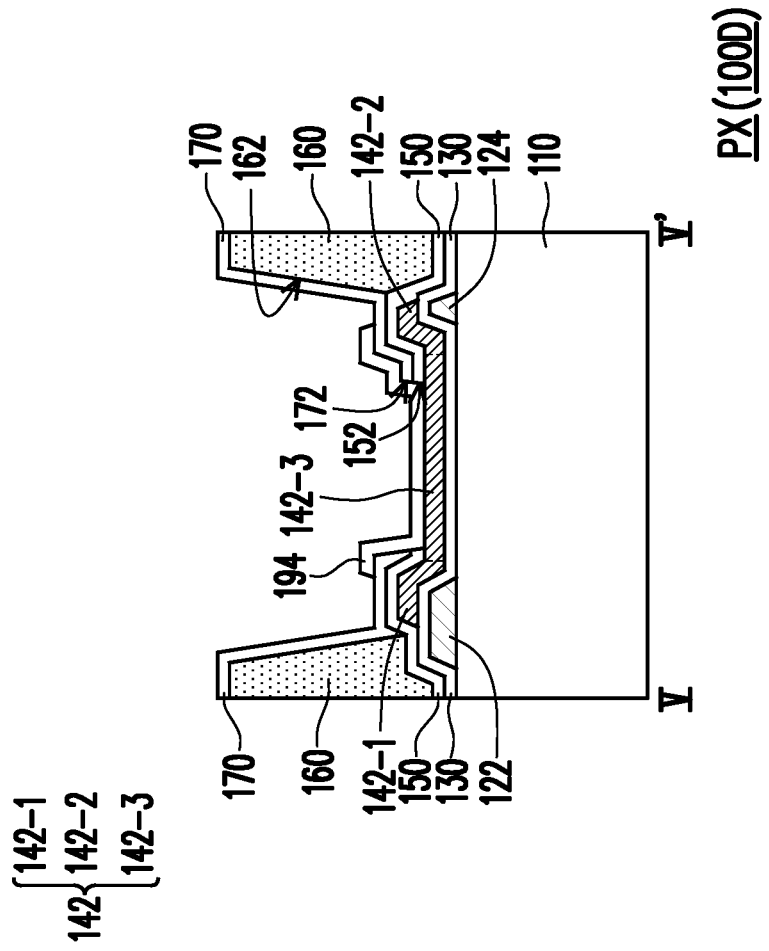
FIG. 23 is a schematic cross-sectional view of the pixel structure PX of the pixel array substrate 100D according to an embodiment of the disclosure.

FIG. 23 is a schematic cross-sectional view of the pixel structure PX of the pixel array substrate 100D according to an embodiment of the disclosure. FIG. 23 corresponds to a section line V-V' of FIG. 22.

The pixel structure PX of FIG. 22 and FIG. 23 may also be selectively applied to the pixel array substrate 100 or 100A.

The pixel structure PX of FIG. 22 and FIG. 23 is similar to the pixel structure PX of FIG. 3 and FIG. 17, so the same or similar elements are indicated by the same or similar reference numerals. The differences between the two are explained below. Please refer to the foregoing description for the same or similar parts of the two, which will not be repeated here.

In the embodiment of FIG. 3 and FIG. 17, an edge 142-1e (labelled in FIG. 3) of the first portion 142-1 of the conductive pattern 142 and an edge 162e (labelled in FIG. 3) of the opening 162 of the color filter pattern 160 are substantially aligned. In other words, in the embodiment of FIG. 3 and FIG. 17, the first portion 142-1 of the conductive pattern 142 does not exceed the opening 162 of the color filter pattern 160.

In the embodiment of FIG. 22 and FIG. 23, the conductive pattern 142 further has a fifth portion 142-5. In the top view of the pixel array substrate 100D, the fifth portion 142-5 of the conductive pattern 142 overlaps with the first common electrode 122 and is located outside the opening 162 of the color filter pattern 160. That is, in the embodiment of FIG. 22 and FIG. 23, the conductive pattern 142 may exceed the opening 162 of the color filter pattern 160.

What is claimed is:
1. A pixel array substrate, comprising:
   a substrate; and
   a plurality of pixel structures, disposed on the substrate, wherein each of the pixel structures comprises:
      a first common electrode;
      a thin film transistor;
      a conductive pattern, electrically connected to the thin film transistor, wherein a first portion of the conductive pattern is disposed on the first common electrode;

a first insulating layer, disposed on the conductive pattern and having an opening overlapping with the conductive pattern;

a color filter pattern, disposed on the first insulating layer and having an opening overlapping with the conductive pattern;

a second insulating layer, disposed on the color filter pattern and having an opening overlapping with the conductive pattern; and a pixel electrode, disposed on the second insulating layer and electrically connected to the conductive pattern through the opening of the first insulating layer and the opening of the second insulating layer, wherein in a top view of the pixel array substrate, the first portion of the conductive pattern covers all edges of the first common electrode located within the opening of the color filter pattern.

2. The pixel array substrate according to claim 1, wherein each of the pixel structures further comprises:

a second common electrode, separated from the first common electrode, wherein a second portion of the conductive pattern is disposed on the second common electrode, wherein in a top view of the pixel array substrate, the second portion of the conductive pattern covers all edges of the second common electrode within the opening of the color filter pattern.

3. The pixel array substrate according to claim 2, wherein the conductive pattern further has a third portion; and in a top view of the pixel array substrate, the third portion of the conductive pattern is located between the first common electrode and the second common electrode, and the opening of the first insulating layer and the opening of the second insulating layer are located on the third portion of the conductive pattern.

4. The pixel array substrate according to claim 2, wherein in a top view of the pixel array substrate, the opening of the first insulating layer and the opening of the second insulating layer are located between the first common electrode and the second common electrode and do not overlap with the first common electrode and the second common electrode.

5. The pixel array substrate according to claim 2, wherein each of the pixel structures further comprises:

a third common electrode, separated from the first common electrode and the second common electrode, wherein a fourth portion of the conductive pattern is disposed on the third common electrode, wherein in a top view of the pixel array substrate, the fourth portion of the conductive pattern covers all edges of the third common electrode within the opening of the color filter pattern.

6. The pixel array substrate according to claim 1, wherein an edge of the first portion of the conductive pattern and an edge of the opening of the color filter pattern are substantially aligned.

7. The pixel array substrate according to claim 1, wherein the conductive pattern further has a fifth portion; and in a top view of the pixel array substrate, the fifth portion of the conductive pattern overlaps with the first common electrode and is located outside the opening of the color filter pattern.

8. The pixel array substrate according to claim 1, wherein the thin film transistor has a gate, which is separated from the first common electrode; a second portion of the conductive pattern is disposed on the gate; and in a top view of the pixel array substrate, the second portion of the conductive pattern covers all edges of the gate located within the opening of the color filter pattern.

9. The pixel array substrate according to claim 8, wherein the conductive pattern has a third portion; and in a top view of the pixel array substrate, the third portion of the conductive pattern is located between the first common electrode and the gate, and the opening of the first insulating layer and the opening of the second insulating layer are located on the third portion of the conductive pattern.

10. The pixel array substrate according to claim 8, wherein in a top view of the pixel array substrate, the opening of the first insulating layer and the opening of the second insulating layer are located between the first common electrode and the gate, and the opening of the first insulating layer and the opening of the second insulating layer do not overlap with the first common electrode and the gate.

11. The pixel array substrate according to claim 1, wherein the pixel structures are arranged into a plurality of pixel columns, and the pixel columns are arranged in a first direction, the pixel array substrate further comprising:

a plurality of scan lines, arranged in a second direction and electrically connected to the pixel structures, wherein the first direction and the second direction intersect;

a plurality of data lines, arranged in the first direction and electrically connected to the pixel columns; and a plurality of transfer lines, arranged in the first direction and electrically connected to the scan lines, wherein the scan lines comprise an (x−n)-th scan line to an x-th scan line, which are sequentially arranged in the second direction, where x is a positive integer greater than or equal to 2, and n is a positive integer and is less than x, and a start time of a gate drive signal of the x-th scan line and an end time of a gate drive signal of the (x−n)-th section overlap in time sequence;

the transfer lines comprise an (x−n)-th transfer line and an x-th transfer line, which are respectively electrically connected to the (x−n)-th scan line and the x-th scan line;

the pixel columns comprise a (k−1)-th pixel column, a k-th pixel column, and a (k+1)-th pixel column, which are sequentially arranged in the first direction, where k is a positive integer greater than or equal to 2;

the data lines comprise a (k−1)-th data line, a k-th data line, and a (k+1)-th data line, which are respectively electrically connected to the (k−1)-th pixel column, the k-th pixel column, and the (k+1)-th pixel column; and in a top view of the pixel array substrate, the (x−n)-th transfer line is disposed between the (k−1)-th data line and the k-th data line, and the x-th transfer line is disposed between the k-th data line and the (k+1)-th data line.

12. The pixel array substrate according to claim 11, wherein the scan lines comprise the (x−n)-th scan line to an (x+n)-th scan line, which are sequentially arranged in the second direction, and an end time of the gate pulse signal of the x-th scan line and a start time of a gate pulse signal of the (x+n)-th scan line overlap in time sequence; the transfer lines further comprise an (x+n)-th transfer line, which is electrically connected to the (x+n)-th scan line; the pixel columns further comprise a (k+2)-th pixel column, and the (k−1)-th pixel column, the k-th pixel column, the (k+1)-th pixel column, and the (k+2)-th pixel column are sequentially arranged in the first direction; the data lines further comprise a (k+2)-th data line, which is electrically connected to the (k+2)-th pixel column; and in a top view of the pixel array substrate, the (x+n)-th transfer line is disposed between the (k+1)-th data line and the (k+2)-th data line.

13. The pixel array substrate according to claim 11, wherein the pixel columns further comprise a (k+2)-th pixel column, and the (k−1)-th pixel column, the k-th pixel column, the (k+1)-th pixel column, and the (k+2)-th pixel column are sequentially arranged in the first direction; and the data lines further comprise a (k+2)-th data line, which is electrically connected to the (k+2)-th pixel column, the pixel array substrate further comprising:
  a first common line, wherein in a top view of the pixel array substrate, the first common line is disposed between the (k+1)-th data line and the (k+2)-th data line.

14. The pixel array substrate according to claim 11, wherein the pixel columns further comprise a (k+2)-th pixel column, and the (k−1)-th pixel column, the k-th pixel column, the (k+1)-th pixel column, and the (k+2)-th pixel column are sequentially arranged in the first direction; the data lines further comprise a (k+2)-th data line, which is electrically connected to the (k+2)-th pixel column; the scan lines comprise an m-th scan line; the transfer lines further comprise an m-th transfer line, which is electrically connected to the m-th scan line, where m is a positive integer greater than 2, and |x−m| is not equal to n; and in a top view of the pixel array substrate, the m-th transfer line is disposed between the (k+1)-th data line and the (k+2)-th data line.

15. The pixel array substrate according to claim 11, wherein the scan lines comprise a (y−n)-th scan line to a y-th scan line, which are sequentially arranged in the second direction, where y is a positive integer greater than or equal to 2, and n is a positive integer and is less than y, and a start time of a gate pulse signal of the y-th scan line and an end time of a gate pulse signal of the (y−n)-th scan line overlap in time sequence; the transfer lines comprise a (y−n)-th transfer line and a y-th transfer line, which are respectively electrically connected to the (y−n)-th scan line and the y-th scan line; the pixel columns comprise a (q−1)-th pixel column, a q-th pixel column, and a (q+1)-th pixel column, which are sequentially arranged in the first direction, where q is a positive integer greater than or equal to 2; the data lines comprise a (q−1)-th data line, a q-th data line, and a (q+1)-th data line, which are respectively electrically connected to the (q−1)-th pixel column, the q-th pixel column, and the (q+1)-th pixel column; and in a top view of the pixel array substrate, the y-th transfer line is disposed between the (q−1)-th data line and the q-th data line, and the (y−n)-th transfer line is disposed between the q-th data line and the (q+1)-th data line.

16. The pixel array substrate according to claim 15, wherein the pixel columns further comprise a (q+2)-th pixel column, and the (q−1)-th pixel column, the q-th pixel column, the (q+1)-th pixel column, and the (q+2)-th pixel column are sequentially arranged in the first direction; and the data lines further comprise a (q+2)-th data line, which is electrically connected to the (q+2)-th pixel column, the pixel array substrate further comprising:
  a second common line, wherein in a top view of the pixel array substrate, the second common line is disposed between the (q+1)-th data line and the (q+2)-th data line.

17. The pixel array substrate according to claim 15, wherein the pixel columns further comprise a (q+2)-th pixel column, and the (q−1)-th pixel column, the q-th pixel column, the (q+1)-th pixel column, and the (q+2)-th pixel column are sequentially arranged in the first direction; the data lines further comprise a (q+2)-th data line, which is electrically connected to the (q+2)-th pixel column; the scan lines comprise a p-th scan line; the transfer lines further comprise a p-th transfer line, which is electrically connected to the p-th scan line, where p is a positive integer greater than 2, and |y−p| is not equal to n; and in a top view of the pixel array substrate, the p-th transfer line is disposed between the (q+1)-th data line and the (q+2)-th data line.

18. The pixel array substrate according to claim 11, wherein n=4.

19. The pixel array substrate according to claim 11, where n=8.

20. The pixel array substrate according to claim 11, wherein one of the scan lines belongs to a first conductive layer, and one of the transfer lines belongs to a second conductive layer; the pixel array substrate further comprises an insulating layer, which is disposed between the first conductive layer and the second conductive layer, and has a contact window; and the one of the scan lines is electrically connected to the one of the transfer lines through the contact window of the insulating layer.

* * * * *